(12) United States Patent
Kimura et al.

(10) Patent No.: US 11,169,312 B2
(45) Date of Patent: Nov. 9, 2021

(54) PRESSURE-SENSITIVE-ADHESIVE-LAYER-ATTACHED POLARIZING FILM, AND IMAGE DISPLAY DEVICE

(71) Applicant: NITTO DENKO CORPORATION, Ibaraki (JP)

(72) Inventors: Tomoyuki Kimura, Ibaraki (JP); Yusuke Toyama, Ibaraki (JP); Eiko Suefusa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/043,276

(22) PCT Filed: Mar. 25, 2019

(86) PCT No.: PCT/JP2019/012490
§ 371 (c)(1),
(2) Date: Sep. 29, 2020

(87) PCT Pub. No.: WO2019/188971
PCT Pub. Date: Oct. 3, 2019

(65) Prior Publication Data
US 2021/0048567 A1 Feb. 18, 2021

(30) Foreign Application Priority Data
Mar. 30, 2018 (JP) .............................. JP2018-069702

(51) Int. Cl.
*G02B 5/30* (2006.01)
*G02B 1/14* (2015.01)
(Continued)

(52) U.S. Cl.
CPC .............. *G02B 5/305* (2013.01); *C09J 7/385* (2018.01); *G02B 1/08* (2013.01); *G02B 1/14* (2015.01);
(Continued)

(58) Field of Classification Search
CPC ...... C09J 7/38; C09J 201/00; C09J 2301/302; C09J 2301/318; C09J 2301/312; C09K 2323/05–059; G02F 1/1335
See application file for complete search history.

(56) References Cited

U.S. PATENT DOCUMENTS

2013/0005911 A1\* 1/2013 Okamoto .............. C08F 120/18
525/210
2013/0170035 A1 7/2013 Jung et al.
(Continued)

FOREIGN PATENT DOCUMENTS

CN 103184019 A 7/2013
CN 105440989 A 3/2016
(Continued)

OTHER PUBLICATIONS

Notification of Transmittal of Translation of the International Preliminary Report on Patentability (Form PCT/IB/338) issued in counterpart International Application No. PCT/JP2019/012490 dated Oct. 15, 2020 with Forms PCT/IB/373 and PCT/ISA/237. (7 pages).
(Continued)

*Primary Examiner* — Sophie Hon
(74) *Attorney, Agent, or Firm* — Westerman, Hattori, Daniels & Adrian, LLP

(57) ABSTRACT

A pressure-sensitive-adhesive-layer-attached polarizing film is disclosed having an odd shape, and capable of reducing occurrence of a crack in a polarizer and preventing peeling and foaming of a pressure-sensitive adhesive layer and warpage of a polarizing film. This pressure-sensitive-adhesive-layer-attached polarizing film comprises a polarizing film, and a pressure-sensitive adhesive layer on one surface of the polarizing film. The pressure-sensitive-adhesive-layer-attached polarizing film has an odd shape other than a rectangular shape, and when a strain gauge is attached to a surface not having the pressure-sensitive adhesive layer of
(Continued)

the polarizing film such that a measurement axis and an absorption axis of the polarizing film intersect at right angles and strain amounts are measured, a difference between a strain amount at −40° C. and a strain amount at 85° C. is 3000µε or less, and the creep value of the pressure-sensitive adhesive layer at 85° C. is 15-600 µm inclusive.

13 Claims, 2 Drawing Sheets

(51) Int. Cl.
  *C09J 7/38* (2018.01)
  *G02B 1/08* (2006.01)
(52) U.S. Cl.
  CPC .... *C09K 2323/031* (2020.08); *C09K 2323/05* (2020.08)

(56) References Cited

U.S. PATENT DOCUMENTS

| | | | |
|---|---|---|---|
| 2016/0085007 | A1 | 3/2016 | Akizuki et al. |
| 2017/0145262 | A1* | 5/2017 | Nam ................... B32B 27/306 |
| 2017/0299920 | A1 | 10/2017 | Mita et al. |
| 2018/0120488 | A1 | 5/2018 | Takada et al. |
| 2018/0283952 | A1* | 10/2018 | Taniguchi ............ G01D 5/3473 |

FOREIGN PATENT DOCUMENTS

| | | | | |
|---|---|---|---|---|
| CN | 106796318 | A | | 5/2017 |
| CN | 107430236 | A | | 12/2017 |
| JP | 2001-350019 | A | | 12/2001 |
| JP | 2008-96734 | A | | 4/2008 |
| JP | 2011-203571 | A | | 10/2011 |
| JP | 2011203571 | A | * | 10/2011 |
| JP | 2016-62028 | A | | 4/2016 |
| JP | 2016071348 | A | * | 5/2016 |
| JP | 2016-118771 | A | | 6/2016 |
| JP | 2017-97111 | A | | 6/2017 |
| JP | 2017-151191 | A | | 8/2017 |
| JP | 6596533 | B2 | * | 10/2019 ............... C09J 7/38 |
| JP | 6596533 | B2 | | 10/2019 |
| KR | 2016-0007389 | A | | 1/2016 |
| KR | 10-2016-0038823 | A | | 4/2016 |
| KR | 2017-0069818 | A | | 6/2017 |
| TW | 201605623 | A | | 2/2016 |
| TW | 201614288 | A | | 4/2016 |
| TW | 201808637 | A | | 3/2018 |
| WO | 2015/099022 | A1 | | 7/2015 |
| WO | 2016/158513 | A1 | | 10/2016 |
| WO | 2016/158608 | A1 | | 10/2016 |
| WO | 2016/167059 | A1 | | 10/2016 |
| WO | 2017/104623 | A1 | | 6/2017 |

OTHER PUBLICATIONS

International Search Report dated Jun. 25, 2019, issued in counterpart International Application No. PCT/JP2019/012490. (2 pages).
Office Action dated Aug. 25, 2020, issued in counterpart of TW Patent Application No. 108110481, with English Translation. (14 pages).
Decision to Grant a Patent dated Aug. 1, 2019, issued in counterpart of JP Patent Application No. 2018-069702, with English Translation. (5 pages).
Office Action dated Dec. 18, 2020, issued in counterpart KR Application No. 10-2020-7023125, with English translation (8 pages).
Office Action dated Nov. 18, 2020, issued in counterpart JP Application No. 2019-155847, with English translation (4 pages).
Search Report dated Feb. 20, 2021, issued in counterpart CN Application No. 201980012898.5, with English Translation. (3 pages).
Office Action dated Jul. 28, 2021, issued in counterpart KR application No. 10-2020-7023125, with English translation. (8 pages).

\* cited by examiner

PRESSURE-SENSITIVE-ADHESIVE-LAYER-ATTACHED POLARIZING FILM, AND IMAGE DISPLAY DEVICE

TECHNICAL FIELD

The invention relates to a pressure-sensitive-adhesive-layer-attached polarizing film including a polarizing film and a pressure-sensitive adhesive layer. Also, the invention relates to an image display device including the pressure-sensitive-adhesive-layer-attached polarizing film.

BACKGROUND ART

In various image display devices, a polarizing film has been used for image display. For example, in a liquid crystal display device (LCD), it is indispensable to dispose polarizing films on both sides of a glass substrate on which a liquid crystal panel surface is formed from the viewpoint of the image forming system. Further, in an organic EL display device, a circularly polarizing film in which a polarizing film and a quarter wavelength plate are laminated is disposed on the viewing side of an organic light emitting layer in order to shield specular reflection of external light on a metal electrode.

A polarizing film generally used includes a polarizer and a protective film or films bonded to one or both surfaces of the polarizer with a polyvinyl alcohol-based adhesive or any other adhesive, in which the polarizer includes a polyvinyl alcohol-based film and a dichroic material such as iodine.

Polarizing films have a problem in that in a harsh environment accompanied by thermal shock (e.g., a heat shock test in which −40° C. and 85° C. temperature conditions are repeated), the polarizer undergoes changes in shrinkage stress, so that cracks (through cracks) can easily occur entirely in the direction of the absorption axis of the polarizer.

For the purpose of providing a polarizing plate excellent in durability even in a thermal shock environment, Patent Document 1 has proposed a polarizing plate in which a transparent protective film is disposed on both sides of a polarizing film, and the difference between a linear expansion coefficient of the polarizing film in a direction perpendicular to an absorption axis thereof and a linear expansion coefficient of the transparent protective film disposed on at least one surface of the polarizing film in a direction perpendicular to an absorption axis of the polarizing plate is $1.3 \times 10^{-4}$/° C. or less. In recent years, a polarizing film having an irregular shape other than a rectangular shape is produced by processing the polarizing film, and Patent Document 2 discloses a method of processing a polarizing film into an irregular shape. In addition, by including inorganic particles which have an irregular shape property in the protective film used for a polarizing film, Patent Document 3 has proposed to improve irregular shape punching property of a polarizing film and crack durability after the heat cycle test of the irregularly shaped polarizing film after punching.

PRIOR ART DOCUMENTS

Patent Documents

Patent Document 1: JP-A-2011-203571
Patent Document 2: JP-A-2017-151191
Patent Document 3: JP-A-2017-97111

SUMMARY OF THE INVENTION

Problems to be Solved by the Invention

However, in the future, an irregularly shaped polarizing film is expected to have not only a simple circular shape as shown in FIG. 1 of Patent Document 2 or a shape for an in-vehicle meter having a gentle curvature as in Patent Document 3, but also a complicated shape. Specifically, there are exemplified an irregularly shaped polarizing film having a curve in a part of the outer peripheral portion of a polarizing film, and an irregularly shaped polarizing film further having a hole in the surface or a U-shaped or V-shaped notch in the outer peripheral portion. Another example is an irregularly shaped polarizing film having a plurality of notches on the outer peripheral portion of the polarizing film.

It is speculated that the irregularly shaped polarizing film having such a complicated shape also complicates stress concentration due to expansion and contraction of the polarizing film, and cracks are more likely to occur in the polarizer than in the past in a severe thermal shock environment.

In view of the above problems, the present inventors have focused on pressure-sensitive adhesive layers used for irregularly shaped polarizing films and studied to reduce the occurrence of a crack in the irregularly shaped polarizing film having a complicated shape. As a result of intensive studies, the present inventors have found an irregularly shaped pressure-sensitive-adhesive-layer-attached polarizing film that can not only reduce the occurrence of a crack in the irregularly shaped polarizing film, but also can favorably suppress the peeling of the pressure-sensitive adhesive layer from the irregularly shaped polarizing film, the foaming of the pressure-sensitive adhesive layer, and the warpage of the irregularly shaped polarizing film.

An object of the present invention is to provide an irregularly shaped pressure-sensitive-adhesive-layer-attached polarizing film having an irregular shape, which can reduce the occurrence of a crack in the polarizer and can suppress peeling and foaming of the pressure-sensitive adhesive layer, and warping of the polarizing film.

Means for Solving the Problems

As a result of intensive studies, the inventors of the present invention have found that the problems described above can be solved by controlling the difference between a strain amount at −40° C. and a strain amount at 85° C. of a pressure-sensitive-adhesive-layer-attached polarizing film within a specific numerical range as well as by controlling a creep value of the pressure-sensitive adhesive layer of the pressure-sensitive-adhesive-layer-attached polarizing film within a specific numerical range. The present invention has been completed based on these findings.

That is, the present invention has the following constitutions.

[1] A pressure-sensitive-adhesive-layer-attached polarizing film comprising:
a polarizing film; and
a pressure-sensitive adhesive layer on one surface of the polarizing film, and having an irregular shape other than a rectangular shape, wherein
when a strain gauge is bonded to a surface not having the pressure-sensitive adhesive layer of the polarizing film such that a measurement axis and an absorption axis of the polarizing film intersect at right angles and strain amounts are measured, a difference between a strain amount at −40° C. and a strain amount at 85° C. is 3000µε or less, and a creep value of the pressure-sensitive adhesive layer at 85° C. is 15 µm or more and 600 µm or less.

[2] The pressure-sensitive-adhesive-layer-attached polarizing film according to [1], wherein the strain amount at −40° C. is −4000µε or more.

[3] The pressure-sensitive-adhesive-layer-attached polarizing film according to [1] or [2], wherein the polarizing film has at least a polarizer and a first protective film, the first protective film is provided between the polarizer and the pressure-sensitive adhesive layer, and a linear expansion coefficient of the first protective film is $7.0 \times 10^{-5}$/K or less.

[4] The pressure-sensitive-adhesive-layer-attached polarizing film according to [3], wherein the first protective film is formed with a cellulose-based polymer.

[5] The pressure-sensitive-adhesive-layer-attached polarizing film according to any one of [1] to [4], wherein the pressure-sensitive adhesive layer has a thickness of 2 µm or more and 30 µm or less.

[6] An image display device having the pressure-sensitive-adhesive-layer-attached polarizing film according to any one of [1] to [5].

Effect of the Invention

According to the first embodiment of the pressure-sensitive-adhesive-layer-attached polarizing film of the present invention, by controlling the difference between a strain amount at −40° C. and a strain amount at 85° C. of the pressure-sensitive-adhesive-layer-attached polarizing film within a specific numerical range, as well as by controlling a creep value of the pressure-sensitive adhesive layer of the pressure-sensitive-adhesive-layer-attached polarizing film within a specific numerical range, it is possible to not only reduce the occurrence of a crack in the polarizer, but also satisfactorily suppress peeling of the pressure-sensitive adhesive layer from an irregularly shaped polarizing film, foaming of the pressure-sensitive adhesive layer, and warping of the irregularly shaped polarizing film, when forming a polarizing film having an irregular shape.

According to the second embodiment of the pressure-sensitive-adhesive-layer-attached polarizing film of the present invention, a crack occurrence reducing effect can be made more remarkable by setting a strain amount (maximum strain amount) at −40° C. of the pressure-sensitive-adhesive-layer-attached polarizing film to −4000µε or more. Specifically, the number of times that can withstand a heat shock until the occurrence of a crack is greatly increased, so that such a polarizing film can be used for a long time in an environment where the temperature changes drastically.

According to the third embodiment of the pressure-sensitive-adhesive-layer-attached polarizing film of the present invention, by controlling a linear expansion coefficient of the first protective film provided between the pressure-sensitive adhesive layer and the polarizer to $7.0 \times 10^{-5}$/K or less, the number of times that can withstand a heat shock until the occurrence of a crack is further increased, so that such a polarizing film can be used for a long time in an environment where the temperature changes drastically.

MODE FOR CARRYING OUT THE INVENTION

Hereinafter, the present invention will be described in detail, but the present invention is not limited to the following embodiments and can be arbitrarily modified and worked without departing from the gist of the present invention.

<1. Pressure-Sensitive-Adhesive-Layer-Attached Polarizing Film>

A pressure-sensitive-adhesive-layer-attached polarizing film of the present invention including:

a polarizing film; and a pressure-sensitive adhesive layer on one surface of the polarizing film, and having an irregular shape other than a rectangular shape, wherein when a strain gauge is bonded to a surface not having the pressure-sensitive adhesive layer of the polarizing film such that a measurement axis and an absorption axis of the polarizing film intersect at right angles and strain amounts are measured, a difference between a strain amount at −40° C. and a strain amount at 85° C. is 3000µε or less, and a creep value of the pressure-sensitive adhesive layer at 85° C. is 15 µm or more and 600 µm or less.

(1-1. Pressure-Sensitive-Adhesive-Layer-Attached Polarizing Film Having Irregular Shape Other than Rectangular Shape)

The "pressure-sensitive-adhesive-layer-attached polarizing film having an irregular shape other than a rectangular shape" refers to a pressure-sensitive-adhesive-layer-attached polarizing film whose planar shape has a shape other than a rectangular shape, while a conventional polarizing film with a rectangular (rectangle-shaped) planar shape (rectangular polarizing film) is defined as a standard. Such a "pressure-sensitive-adhesive-layer-attached polarizing film having an irregular shape other than a rectangular shape" (hereinafter sometimes referred to as an "irregularly shaped polarizing film") is used for an "irregularly shaped display panel" whose planar shape (display surface) is other than a rectangle, in contrast to use for a conventional one (rectangular display panel) whose planar shape (display surface) is rectangular (rectangle-shaped). Examples of the irregularly shaped polarizing film are able to include free shapes, such as a circle, an ellipse, and a polygon (for example, a triangle, a pentagon, a hexagon, an octagon, etc.), a shape in which at least one of the four corners of a rectangle is rounded or cut, a shape in which a U-shaped or V-shaped notch (cutout) is provided in a part of the outer peripheral portion of a rectangle, a shape in which one or more circular holes are provided in the surface, a shape in which the outer peripheral portion is formed by a curved line and a V notch, and a shape combining two or more of these shapes, according to the shape of an irregularly shaped display panel used for a smart watch, an in-vehicle meter, or the like.

The irregularly shaped polarizing film of the present invention has, for example, a shape as exemplified in each of FIG. 3 to FIG. 10.

Figure 7:
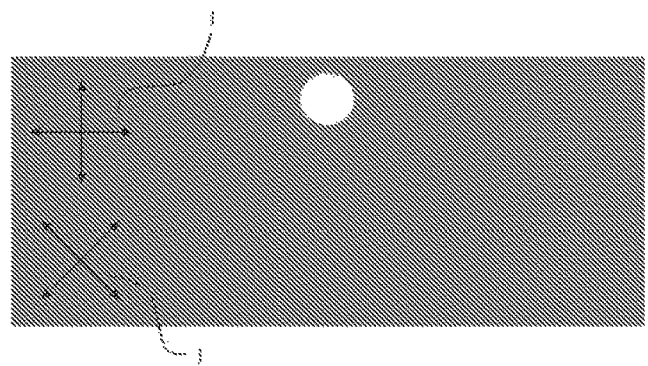
FIG. 7 is a view showing one embodiment of the pressure-sensitive-adhesive-layer-attached polarizing film having an in-plane circular hole of the present invention.
Figure 8:
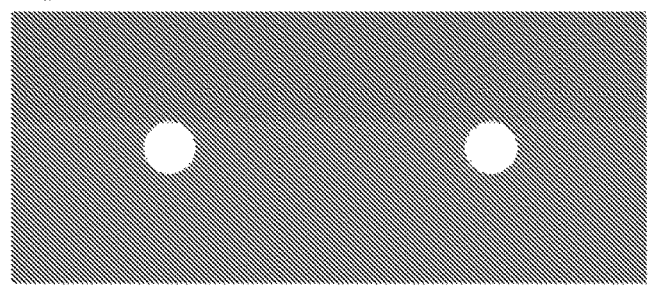
FIG. 8 is a view showing one embodiment of the pressure-sensitive-adhesive-layer-attached polarizing film having an in-plane circular hole of the present invention.
Figure 9:
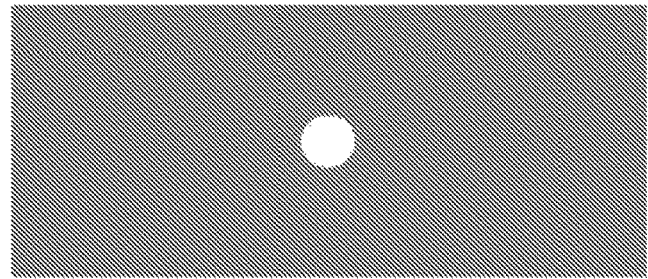
FIG. 9 is a view showing one embodiment of the pressure-sensitive-adhesive-layer-attached polarizing film having an in-plane circular hole of the present invention.
Figure 10:
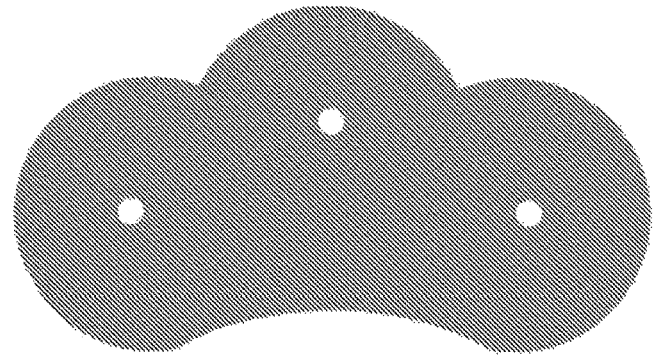
FIG. 10 is a view showing one embodiment of the pressure-sensitive-adhesive-layer-attached polarizing film having an outer peripheral portion formed by a curved line and a V notch and having an in-plane circular hole of the present invention.

In addition, as shown in FIG. 7, the irregularly shaped polarizing film of the present invention has a configuration in which the absorption axis and the transmission axis are parallel to the long side and the short side, respectively, and a configuration in which the absorption axis and the transmission axis make an angle of 45° with respect to the long side and the short side, respectively.

Examples of a method for producing the irregularly shaped polarizing film of the present invention include a laser method, an end-mill method, and a die punching method. After producing a rectangular pressure-sensitive-adhesive-layer-attached polarizing film, such a film is processed into an irregular shape other than a rectangular shape using the method described above, thereby to obtain an irregularly shaped polarizing film.

(1-2. Difference Between Strain Amount at −40° C. and Strain Amount at 85° C.)

In the irregularly shaped polarizing film of the present invention, when a strain gauge is attached to a surface not having the pressure-sensitive adhesive layer of the polarizing film such that a measurement axis and an absorption axis of the polarizing film intersect at right angles and strain amounts are measured, a difference between a strain amount at −40° C. and a strain amount at 85° C. (hereinafter, referred sometimes to as a "difference in strain amount") is 3000µε or less. The difference in strain amount can be obtained by subtracting the strain amount at −40° C. from the strain amount at 85° C.

Here, as a method of controlling the difference in strain amount to 3000µε or less, for example, a method of adjusting the storage modulus of the pressure-sensitive adhesive layer and the thickness of the pressure-sensitive adhesive layer at 85° C. to a predetermined range can be mentioned. As a method of further suppressing the difference in strain amount, a method of adjusting the linear expansion coefficient of the first protective film provided between the polarizer and the pressure-sensitive adhesive layer to a predetermined range in addition to the adjustment of the storage modulus of the pressure-sensitive adhesive layer and the thickness of the pressure-sensitive adhesive layer at 85° C. can be mentioned.

More specifically, by controlling the storage modulus of the pressure-sensitive adhesive layer at 85° C. to $5.0 \times 10^4$ Pa or more and the thickness of the pressure-sensitive adhesive layer to 30 µm or less, it is possible to control the range of the difference in strain amount. In the case where the first protective film is provided between the polarizer and the pressure-sensitive adhesive layer, the difference in strain amount can be further suppressed by setting the linear expansion coefficient of the first protective film to $7.0 \times 10^{-5}$/K or less.

An embodiment of the method for setting the storage modulus of the pressure-sensitive adhesive layer at 85° C. to $5.0 \times 10^4$ Pa or more will be described in detail later in (2-6. Storage modulus at 85° C. of the pressure-sensitive adhesive layer).

The difference in strain amount according to the present invention is not particularly limited as long as the difference is 3000µε or less, but is preferably 2500µε or less, more preferably 2000µε or less, still more preferably 1500µε or less, particularly preferably 1000µε or less, and most preferably 500µε or less. By controlling the difference in strain amount to the above range, the number of heat shock tests until the occurrence of a crack increases. That is to say, the irregularly shaped display panel can be used satisfactorily for a long time even in an environment where the temperature changes drastically.

In the present invention, the strain amount at −40° C. is not particularly limited as long as such a strain amount satisfies the strain difference range described above, but is usually −4500µε or more, preferably −4000µε or more, more preferably −3000µε or more. From the viewpoint of further reducing the occurrence of a crack, the strain amount at −40° C. is still more preferably −2500 or more. On the other hand, the upper limit of strain amount at −40° C. is usually 0µε. When the strain amount at −40° C. is too large, the occurrence of a crack may be increased. This is because when the temperature changes from 85° C. to −40° C., the polarizing film at the time of reaching −40° C. shrinks the most with respect to the polarizing film before shrinking.

(1-3. Creep Value of Pressure-Sensitive Adhesive Layer at 85° C.)

The irregularly shaped polarizing film of the present invention has a creep value of the pressure-sensitive adhesive layer at 85° C. (hereinafter sometimes referred to as "creep value") of 15 µm or more and 600 µm or less.

Here, as a method for controlling the creep value in the range of 15 µm or more and 600 µm or less, details will be described later. For example, there is a method of controlling the gel fraction after aging treatment within a range of 70% or more and 93% or less so as not to deviate from the strain amount range. The method for controlling the gel fraction within the range of 70% or more and 93% or less after aging treatment so as not to deviate from the strain amount range will be described in detail in (2-7. Gel fraction after aging treatment).

The creep value according to the present invention is not particularly limited as long as the value is 15 µm or more and 600 µm or less, but the lower limit of the creep value is preferably 30 µm or more, more preferably 60 µm or more. On the other hand, the upper limit of the creep value is preferably 300 µm or less, more preferably 200 µm or less, and particularly preferably 150 µm or less. When the lower limit of the creep value is less than 15 µm, a stress relaxation property of the pressure-sensitive adhesive is lowered, so that panel warpage may be increased, or the pressure-sensitive adhesive layer may be easily peeled off in the durability test described in the Examples. In addition, when the upper limit of the creep value exceeds 600 µm, there is a fear such that the pressure-sensitive adhesive layer becomes insufficient in cohesive force, so that foaming in the pressure-sensitive adhesive layer occurs in the durability test described in the Examples, and adhesive stains and dents are likely to occur. As a result, there is a risk that processability in the pressure-sensitive adhesive layer will be reduced.

<2. Pressure-Sensitive Adhesive Layer>

The pressure-sensitive adhesive layer of the pressure-sensitive-adhesive-layer-attached polarizing film of the present invention is formed from a pressure-sensitive adhesive composition containing a (meth)acryl-based polymer (A) containing at least an alkyl (meth)acrylate as a monomer unit.

(2-1. (Meth)Acryl-Based Polymer (A))

The (meth)acryl-based polymer (A) of the present invention contains the alkyl (meth)acrylate as a main component. (Meth)acrylate refers to acrylate and/or methacrylate, and "(meth)" in the present invention is used in the same meaning.

Examples of the alkyl (meth)acrylate constituting the main skeleton of the (meth)acryl-based polymer (A) include those whose linear or branched alkyl group has 1 to 18 carbon atoms. Examples of the alkyl group include a methyl group, an ethyl group, a propyl group, an isopropyl group, a butyl group, an isobutyl group, an amyl group, a hexyl group, a cyclohexyl group, a heptyl group, a 2-ethylhexyl group, an isooctyl group, a nonyl group, a decyl group, an isodecyl group, a dodecyl group, an isomyristyl group, a lauryl group, a tridecyl group, a pentadecyl group, a hexadecyl group, a heptadecyl group, an octadecyl group, and the like. These alkyl (meth)acrylates may be used alone or in combination of them. The average number of carbon atoms in the alkyl group is preferably 3 to 9.

The (meth)acryl-based polymer (A) may contain, as a constituent monomer, a copolymerizable monomer such as a carboxyl group-containing monomer ($a_1$) and a hydroxyl group-containing monomer ($a_2$) in addition to the alkyl (meth)acrylate. These copolymerizable monomers can be used alone or in combination thereof.

The carboxyl group-containing monomer ($a_1$) is a compound containing a carboxyl group in its structure and a polymerizable unsaturated double bond such as a (meth)acryloyl group or a vinyl group. Examples of the carboxyl group-containing monomer include (meth)acrylic acid, carboxyethyl (meth)acrylate, carboxypentyl (meth)acrylate, itaconic acid, maleic acid, fumaric acid, and crotonic acid. Among these, acrylic acid is preferable from the viewpoints of copolymerizability, price, and improving the adhesive properties of the pressure-sensitive adhesive layer.

When the carboxyl group-containing monomer ($a_1$) is used as the monomer component, the content of the carboxyl group-containing monomer ($a_1$) is usually 0.01% by weight or more and 10% by weight or less with respect to all monomer components forming the (meth)acryl-based polymer (A).

The hydroxyl group-containing monomer ($a_2$) is a compound containing a hydroxyl group in its structure and having a polymerizable unsaturated double bond such as a (meth)acryloyl group or a vinyl group. Examples of the hydroxyl group-containing monomer include hydroxyalkyl (meth)acrylates such as 2-hydroxyethyl (meth)acrylate, 3-hydroxypropyl (meth)acrylate, 4-hydroxybutyl (meth) acrylate, 6-hydroxyhexyl (meth)acrylate, 8-hydroxyoctyl (meth)acrylate, 10-hydroxydecyl (meth)acrylate, and 12-hydroxylauryl (meth)acrylate; and (4-hydroxymethylcyclohexyl)-methylacrylate. Among them, 2-hydroxyethyl (meth) acrylate and 4-hydroxybutyl (meth)acrylate are preferred, and 4-hydroxybutyl (meth)acrylate is more preferred from the viewpoint of improving durability of the pressure-sensitive adhesive layer.

When the hydroxyl group-containing monomer ($a_2$) is used as the monomer component, the content of the hydroxyl group-containing monomer ($a_2$) is usually 0.01% by weight or more and 10% by weight or less with respect to all monomer components forming the (meth)acryl-based polymer (A).

The (meth)acryl-based polymer (A) preferably contains a monomer having an unsaturated carbon double bond with a homopolymer glass transition temperature of 0° C. or more as a constituent monomer. Examples of the monomer ($a_3$) having an unsaturated carbon double bond whose homopolymer glass transition temperature is 0° C. or more include alkyl (meth)acrylate monomers and (meth)acrylic acid. The monomer ($a_3$) is preferably a monomer whose homopolymer has a glass transition temperature of 20° C. or more has an unsaturated carbon double bond. More preferably, the monomer ($a_3$) is a monomer whose homopolymer has a glass transition temperature of 40° C. or more has an unsaturated carbon double bond.

In the (meth)acryl-based polymer (A), the proportion of the monomer ($a_3$) is not particularly limited, but is usually 0.1 to 20% by weight, more preferably 1 to 15% by weight. Further, when using 2 or more kinds of such monomers ($a_3$) together, the proportion is a weight percent in total.

Examples of the monomer ($a_3$) include linear alkyl (meth) acrylates, such as methyl acrylate (Tg: 8° C.), methyl methacrylate (Tg: 105° C.), ethyl methacrylate (Tg: 65° C.), n-propyl acrylate (Tg: 3° C.), n-propyl methacrylate (Tg: 35° C.), n-pentyl acrylate (Tg: 22° C.), n-tetradecyl acrylate (Tg: 24° C.), n-hexadecyl acrylate (Tg: 35° C.), n-hexadecyl methacrylate (Tg: 15° C.), n-stearyl acrylate (Tg: 30° C.), and n-stearyl methacrylate (Tg: 38° C.); branched chain alkyl (meth)acrylates, such as t-butyl acrylate (Tg: 43° C.), t-butyl methacrylate (Tg: 48° C.), i-propyl methacrylate (Tg: 81° C.), and i-butyl methacrylate (Tg: 48° C.); cyclic alkyl (meth)acrylates, such as cyclohexyl acrylate (Tg: 19° C.), cyclohexyl methacrylate (Tg: 65° C.), isobornyl acrylate (Tg: 94° C.), and isobornyl methacrylate (Tg: 180° C.); and acrylic acid (Tg: 106° C.). These can be used alone or in combination thereof.

When the pressure-sensitive adhesive composition contains a crosslinking agent that will be described later, the copolymerizable monomer functions as a site of reaction with the crosslinking agent. The carboxyl group-containing monomer and the hydroxyl group-containing monomer are highly reactive with an intermolecular crosslinking agent and are therefore preferably used to improve the cohesiveness and heat resistance of a resulting pressure-sensitive adhesive layer. Further, the carboxyl group-containing monomer is preferred from the viewpoint of achieving both durability and reworkability, and the hydroxyl group-containing monomer is preferred from the viewpoint of improving reworkability.

In the present invention, the amount of the alkyl (meth) acrylate is preferably 50% by weight or more with respect to the total amount of monomer components forming the (meth)acryl-based polymer (A) from the viewpoint of improving the adhesiveness of the pressure-sensitive adhesive layer. The amount of the alkyl (meth)acrylate can be freely set as the balance of monomers other than the alkyl (meth)acrylate.

In the present invention, as the monomer component, other copolymerizable monomer having a polymerizable functional group with an unsaturated double bond, such as a (meth)acryloyl group or a vinyl group, can be used in addition to the alkyl (meth)acrylate and the copolymerizable monomer for the purpose of improving the adhesiveness and heat resistance of the pressure-sensitive adhesive layer. The other copolymerizable monomers may be used alone or in combination thereof.

(2-2. Method for Producing (Meth)Acryl-Based Polymer (A))

The (meth)acryl-based polymer (A) can be produced by a known production method appropriately selected from various radical polymerization methods such as solution polymerization, radiation polymerization such as electron beam polymerization or UV polymerization, bulk polymerization, and emulsion polymerization. The resulting (meth)acryl-based polymer (A) may be any one of random copolymers, block copolymers, and graft copolymers.

It is to be noted that in the solution polymerization, for example, ethyl acetate or toluene is used as a polymerization solvent. In a specific example of the solution polymerization, the reaction is usually performed in the presence of a polymerization initiator under a stream of an inert gas such as nitrogen at about 50 to 70° C. for about 5 to 30 hours.

A polymerization initiator, a chain transfer agent, an emulsifier, and the like used in the radical polymerization are not particularly limited and can be appropriately selected. It is to be noted that the weight average molecular weight of the (meth)acryl-based polymer (A) can be controlled by the amount of the polymerization initiator or the chain transfer agent to be used or reaction conditions. The amount of the polymerization initiator or the chain transfer agent to be used is appropriately adjusted depending on the type thereof.

Examples of the polymerization initiator include, but are not limited to, azo-based initiators such as 2,2'-azobisisobutyronitrile, 2,2'-azobis(2-amidinopropane) dihydrochloride, 2,2'-azobis[2-(5-methyl-2-imidazolin-2-yl)propane] dihydrochloride, 2,2'-azobis(2-methylpropionamidine) disulfate, 2,2'-azobis(N,N'-dimethyleneisobutylamidine), and 2,2'-azobis[N-(2-carboxyethyl)-2-methylpropionamidine] hydrate (VA-057, manufactured by Wako Pure Chemical Industries, Ltd.); persulfates such as potassium persulfate and ammonium persulfate; peroxide-based initiators such as di(2-ethylhexyl) peroxydicarbonate, di(4-t-butylcyclohexyl) peroxydicarbonate, di-sec-butyl peroxydicarbonate, t-butyl peroxyneodecanoate, t-hexyl peroxypivalate, t-butyl peroxypivalate, dilauroyl peroxide, di-n-octanoyl peroxide, 1,1,3,3-tetramethylbutylperoxy-2-ethylhexanoate, di(4-methylbenzoyl) peroxide, dibenzoyl peroxide, t-butyl peroxyisobutyrate, 1,1-di(t-hexylperoxy)cyclohexane, t-butyl hydroperoxide, and hydrogen peroxide; and redox-based initiators using a peroxide and a reducing agent in combination, such as a combination of a persulfate and sodium hydrogen sulfite and a combination of a peroxide and sodium ascorbate.

These polymerization initiators may be used alone or in combination thereof. However, the total amount of the polymerization initiators to be used is preferably about 0.005 to 1 part by weight, more preferably about 0.01 to 0.5 parts by weight, with respect to 100 parts by weight of the monomer component.

Examples of the chain transfer agent include lauryl mercaptan, glycidyl mercaptan, mercaptoacetic acid, 2-mercaptoethanol, thioglycolic acid, 2-ethylhexyl thioglycolate, and 2,3-dimercapto-1-propanol. These chain transfer agents may be used alone or as a mixture in combination of two or more of them. However, the total amount of the chain transfer agents to be used is about 0.1 parts by weight or less with respect to 100 parts by weight of the monomer component.

Examples of the emulsifier used for emulsion polymerization include anionic emulsifiers such as sodium lauryl sulfate, ammonium lauryl sulfate, sodium dodecylbenzene sulfonate, ammonium polyoxyethylene alkyl ether sulfate, and sodium polyoxyethylene alkyl phenyl ether sulfate; nonionic emulsifiers such as polyoxyethylene alkyl ether, polyoxyethylene alkyl phenyl ether, polyoxyethylene fatty acid ester, and polyoxyethylene-polyoxypropylene block polymer. These emulsifiers may be used alone or in combination thereof.

Specific examples of the reactive emulsifier having an introduced radical polymerizable functional group, such as a propenyl group or an allyl ether group include Aqualon HS-10, HS-20, KH-10, BC-05, BC-10, and BC-20 (all manufactured by DKS Co., Ltd.) and ADEKA REASOAP SE10N (manufactured by ADEKA Corporation). The reactive emulsifier is taken into a polymer chain after polymerization and is therefore preferred from the viewpoint of improving water resistance. The amount of the emulsifier to be used is preferably 0.3 to 5 parts by weight with respect to 100 parts by weight of the total amount of the monomer components, and more preferably 0.5 to 1 part by weight from the viewpoints of polymerization stability and mechanical stability.

When the (meth)acryl-based polymer (A) is produced by radiation polymerization, the monomer component is polymerized by exposure to radiation such as electron beams or UV rays. When the radiation polymerization is performed using electron beams, it is not particularly necessary to add a photopolymerization initiator to the monomer component. However, when the radiation polymerization is performed by UV polymerization, a photopolymerization initiator may be added to the monomer component because there is an advantage that polymerization time can be particularly reduced. These photopolymerization initiators may be used alone or in combination thereof.

The photopolymerization initiator is not particularly limited so long as photopolymerization can be initiated and photopolymerization initiators that have been usually used may be employed. Examples of such a photopolymerization initiator include benzoin ether-based, acetophenone-based, α-ketol-based, photoactive oxime-based, benzoin-based, benzyl-based, benzophenone-based, ketal-based, and thioxanthone-based photopolymerization initiators. The amount of the photopolymerization initiator to be used is 0.05 to 1.5 parts by weight, preferably 0.1 to 1 part by weight, with respect to 100 parts by weight of the monomer component. These photopolymerization initiators may be used alone or in combination thereof.

The (meth)acryl-based polymer (A) usually used has a weight average molecular weight of 500,000 to 2,500,000. It is to be noted that the weight average molecular weight is determined by GPC (gel permeation chromatography) and calculated from polystyrene conversion.

(2-3. Reactive Functional Group-Containing Silane Coupling Agent)

The pressure-sensitive adhesive composition of the present invention can contain a reactive functional group-containing silane coupling agent. In the reactive functional group-containing silane coupling agent, the reactive functional group is a functional group other than an acid anhydride group. Examples of the functional group other than the acid anhydride group include preferably any one or more of epoxy group, mercapto group, amino group, isocyanate group, isocyanurate group, vinyl group, styryl group, acetoacetyl group, ureido group, thiourea group, (meth) acrylic group, and heterocyclic group. The reactive functional group-containing silane coupling agents can be used alone or in combination thereof.

Examples of the reactive functional group-containing silane coupling agent include epoxy group-containing silane coupling agents such as 3-glycidoxypropyltrimethoxysilane, 3-glycidoxypropyltriethoxysilane, 3-glycidoxypropylmethyldiethoxysilane, and 2-(3,4-epoxycyclohexyl)ethyltrimethoxysilane; mercapto group-containing silane coupling agents such as 3-mercaptopropylmethyldimethoxysilane and 3-mercaptopropyltrimethoxysilane; amino group-containing silane coupling agents such as 3-aminopropyltrimethoxysilane, N-2-(aminoethyl)-3-aminopropylmethyldimethoxysilane, 3-triethoxysilyl-N-(1,3-dimethylbutylidene)propylamine, and N-phenyl-γ-aminopropyltrimethoxysilane; isocyanate group-containing silane coupling agents such as 3-isocyanatopropyltriethoxysilane; vinyl group-containing silane coupling agents such as vinyltrimethoxysilane and vinyltriethoxysilane; styryl group-containing silane coupling agents such as p-styryltrimethoxysilane; (meth)acrylic group-containing silane coupling agents such as 3-acryloxypropyltrimethoxysilane and 3-methacryloxypropyltriethoxysilane. Among them, epoxy group-containing silane coupling agents and mercapto group-containing silane coupling agents are preferred.

As the reactive functional group-containing silane coupling agent, one having a plurality of alkoxysilyl groups in its molecule (oligomer-type silane coupling agent) may also be used. Specific examples thereof include epoxy group-containing oligomer-type silane coupling agents manufactured by Shin-Etsu Chemical Co., Ltd. under the trade names of "X-41-1053", "X-41-1059A", "X-41-1056", and "X-40-2651"; and mercapto group-containing oligomer-type silane coupling agents manufactured by Shin-Etsu Chemical Co., Ltd. under the trade names of "X-41-1818", "X-41-1810", and "X-41-1805". The oligomer-type silane coupling agent is preferred because such silane coupling agent is less likely to evaporate, has two or more alkoxysilyl groups, and is therefore effective at improving durability.

When the reactive functional group-containing silane coupling agent is added to the pressure-sensitive adhesive composition, the content of the reactive functional group-containing silane coupling agent is usually 0.001 parts by weight or more and 5 parts by weight or less with respect to 100 parts by weight of the (meth)acryl-based polymer (A).

(2-4. Crosslinking Agent)

The pressure-sensitive adhesive composition of the present invention may contain a crosslinking agent. The crosslinking agent to be used may be an organic crosslinking agent, a polyfunctional metallic chelate, or the like. Examples of the organic crosslinking agent include an isocyanate-based crosslinking agent, a peroxide-based crosslinking agent, an epoxy-based cross-linking agent, and an imine-based crosslinking agent. The polyfunctional metallic chelate contains a polyvalent metal and an organic compound which are covalently or coordinately bonded to each other. Examples of the polyvalent metallic atom include Al, Cr, Zr, Co, Cu, Fe, Ni, V, Zn, In, Ca, Mg, Mn, Y, Ce, Sr, Ba, Mo, La, Sn, and Ti. The organic compound contains an oxygen atom or the like as an atom that forms a covalent or coordinate bond. Examples of the organic compound include alkyl esters, alcohol compounds, carboxylic compounds, ether compounds, and ketone compounds. The crosslinking agents may be used alone or in combination thereof.

The crosslinking agent is preferably an isocyanate-based crosslinking agent and/or a peroxide-based crosslinking agent, more preferably a combination of an isocyanate-based crosslinking agent and a peroxide-based crosslinking agent.

The isocyanate-based crosslinking agent includes a compound having at least two isocyanate groups (including isocyanate regenerative functional groups in which the isocyanate groups are temporarily protected with a blocking agent or by oligomerization). Examples of such a compound to be used include known aliphatic polyisocyanates, alicyclic polyisocyanates, and aromatic polyisocyanates, all of which are generally used for urethanization reaction.

Examples of the aliphatic polyisocyanate include trimethylene diisocyanate, tetramethylene diisocyanate, hexamethylene diisocyanate, pentamethylene diisocyanate, 1,2-propylene diisocyanate, 1,3-butylene diisocyanate, dodecamethylene diisocyanate, and 2,4,4-trimethylhexamethylene diisocyanate.

Examples of the alicyclic isocyanate include 1,3-cyclopentene diisocyanate, 1,3-cyclohexane diisocyanate, 1,4-cyclohexane diisocyanate, isophorone diisocyanate, hydrogenated diphenylmethane diisocyanate, hydrogenated xylylene diisocyanate, hydrogenated tolylene diisocyanate, and hydrogenated tetramethylxylylene diisocyanate.

Examples of the aromatic diisocyanate include phenylene diisocyanate, 2,4-tolylene diisocyanate, 2,6-tolylene diisocyanate, 2,2'-diphenylmethane diisocyanate, 4,4'-diphenylmethane diisocyanate, 4,4'-toluidine diisocyanate, 4,4'-diphenyl ether diisocyanate, 4,4'-diphenyl diisocyanate, 1,5-naphthalene diisocyanate, and xylylene diisocyanate.

In addition, examples of the isocyanate-based crosslinking agent include multimers (e.g., dimers, trimers, pentamers), urethane-modified products obtained by reaction with a polyhydric alcohol such as trimethylolpropane, urea-modified products, biuret-modified products, allophanate-modified products, isocyanurate-modified products, and carbodiimide-modified products of the above-mentioned diisocyanates.

Examples of a commercially-available product of the isocyanate-based crosslinking agent include products manufactured by Tosoh Corporation under the trade names of "MILLIONATE MT" "MILLIONATE MTL", "MILLIONATE MR-200", "MILLIONATE MR-400", "CORONATE L", "CORONATE HL", and "CORONATE HX" and products manufactured by Mitsui Chemicals Inc. under the trade names of "TAKENATE D-110N", "TAKENATE D-120N" "TAKENATE D-140N" "TAKENATE D-160N" "TAKENATE D-165N", "TAKENATE D-170HN", "TAKENATE D-178N", "TAKENATE 500", and "TAKENATE 600".

The isocyanate-based crosslinking agent is preferably an aromatic polyisocyanate, an aromatic polyisocyanate-based compound that is a modified product of the aromatic polyisocyanate, an aliphatic polyisocyanate, or an aliphatic polyisocyanate-based compound that is a modified product of the aliphatic polyisocyanate. The aromatic polyisocyanate-based compound is suitably used for its excellent balance between crosslinking speed and pot life. Particularly preferred examples of the aromatic polyisocyanate-based compound include tolylenediisocyanate and modified products thereof.

As the peroxide, anyone can be appropriately used as long as it generates a radical active species by heating or light irradiation to promote the crosslinking of a base polymer ((meth)acryl-based polymer (A)) of the pressure-sensitive adhesive composition. However, in consideration of workability and stability, a peroxide whose one-minute half-life temperature is 80° C. to 160° C. is preferably used, and a peroxide whose one-minute half-life temperature is 90° C. to 140° C. is more preferably used.

Examples of the peroxide include di(2-ethylhexyl) peroxydicarbonate (one-minute half-life temperature: 90.6° C.), di(4-t-butylcyclohexyl) peroxydicarbonate (one-minute half-life temperature: 92.1° C.), di-sec-butyl peroxydicarbonate (one-minute half-life temperature: 92.4° C.), t-butyl peroxyneodecanoate (one-minute half-life temperature: 103.5° C.), t-hexyl peroxypivalate (one-minute half-life temperature: 109.1° C.), t-butyl peroxypivalate (one-minute half-life temperature: 110.3° C.), dilauroyl peroxide (one-minute half-life temperature: 116.4° C.), di-n-octanoyl peroxide (one-minute half-life temperature: 117.4° C.), 1,1,3,3-tetramethylbutyl peroxy-2-ethylhexanoate (one-minute half-life temperature: 124.3° C.), di(4-methylbenzoyl) peroxide (one-minute half-life temperature: 128.2° C.), dibenzoyl peroxide (one-minute half-life temperature: 130.0° C.), t-butyl peroxyisobutyrate (one-minute half-life temperature: 136.1° C.), and 1,1-di(t-hexyl peroxy)cyclohexane (one-minute half-life temperature: 149.2° C.). Among them, di(4-t-butylcyclohexyl) peroxydicarbonate (one-minute half-life temperature: 92.1° C.), dilauroyl peroxide (one-minute half-life temperature: 116.4° C.), and dibenzoyl peroxide (one-minute half-life temperature: 130.0° C.) are particularly excellent in crosslinking reaction efficiency.

It is to be noted that the half-life of a peroxide is an indicator showing the decomposition rate of the peroxide and means the time until the remaining amount of the peroxide is halved. The decomposition temperature for obtaining a half-life at an arbitrary time and the half-life time at an arbitrary temperature are described in manufacturer's catalogs such as "ORGANIC PEROXIDES 9th EDITION (May 2003)" of NOF Corporation.

When the crosslinking agent is added to the pressure-sensitive adhesive composition, the amount of the crosslinking agent is preferably 0.01 parts by weight or more and 15 parts by weight or less with respect to 100 parts by weight of the (meth)acryl-based polymer (A).

When the isocyanate-based crosslinking agent is added to the pressure-sensitive adhesive composition, the amount of the isocyanate-based crosslinking agent is usually 0.01 parts by weight or more and 15 parts by weight or less with respect to 100 parts by weight of the (meth)acryl-based polymer.

When the peroxide is added to the pressure-sensitive adhesive composition, the amount of the peroxide is usually 0.01 parts by weight or more and 2 parts by weight or less with respect to 100 parts by weight of the (meth)acryl-based polymer. The amount of the peroxide is appropriately selected within the above range to adjust processability and crosslinking stability.

(2-5. Other Components)

The pressure-sensitive adhesive composition used in the present invention may contain an ionic compound. The ionic compound is not particularly limited, and an ionic compound used in this field may be suitably used. Examples of such an ionic compound include those described in JP 2015-4861 A. Among them, (perfluoroalkylsulfonyl)imide lithium salts are preferred and lithium bis(trifluoromethanesulfonylimide) lithium is more preferred. The ratio of the ionic compound is not particularly limited so long as the effects of the present invention are not impaired. For example, the ratio of the ionic compound is preferably 10 parts by weight or less, more preferably 5 parts by weight or less, still more preferably 3 parts by weight or less, particularly preferably 1 part by weight or less, with respect to 100 parts by weight of the (meth)acryl-based polymer (A).

The pressure-sensitive adhesive composition of the present invention may contain other known additives. For example, the following additives may be appropriately added depending on the intended use: powders of colorants or pigments, dyes, surfactants, plasticizers, tackifiers, surface lubricants, leveling agents, softeners, antioxidants, anti-aging agents, light stabilizers, UV absorbers, polymerization inhibitors, inorganic or organic fillers, metallic powders, and granular or foil-shaped materials. A redox system may be used by adding a reducing agent within a controllable range. The amount of each of these additives to be used is preferably 5 parts by weight or less, more preferably 3 parts by weight or less, still more preferably 1 part by weight or less, with respect to 100 parts by weight of the (meth)acryl-based polymer (A).

(2-6. Storage Modulus of Pressure-Sensitive Adhesive Layer at 85° C.)

The embodiments of a method for setting a storage modulus of the pressure-sensitive adhesive layer at 85° C. to $5.0 \times 10^4$ Pa or more includes, for example, the following (1) to (3). Taking into account the thickness of the pressure-sensitive adhesive layer and the linear expansion coefficient of the first protective film, a range of a strain amount difference defined in the present invention can be controlled by any one of the following (1) to (3) or a combination of two or more thereof.

(1) In all the monomer components forming the (meth)acryl-based polymer (A), the content of an alkyl acrylate having an alkyl group with an average carbon number of 3 to 5 is 80% by weight or more.

(2) In all the monomer components forming the (meth)acryl-based polymer (A), a monomer having an unsaturated carbon double bond whose homopolymer has a glass transition temperature of 0° C. or more is 4% by weight or more and 20% by weight or less. For example, as a monomer having a glass transition temperature of the homopolymer of 100° C. or more, methyl methacrylate, acrylic acid or the like is contained in an amount of 4% by weight or more and 20% by weight or less with respect to the (meth)acryl-based polymer (A).

(3) A polyfunctional isocyanate is contained in an amount of 4 parts by weight or more and 12 parts by weight or less with respect to 100 parts by weight of the (meth)acryl-based polymer (A). For example, CORONATE or the like is contained in an amount of 4 parts by weight or more and 12 parts by weight or less with respect to 100 parts by weight of the (meth)acryl-based polymer (A).

Moreover, in order to control the storage modulus of the pressure-sensitive adhesive layer at 85° C. to a more preferable range described later, it is preferable to combine two or more embodiments of the above (1) to (3), and an embodiment of a combination of (2) and (3) is more preferable.

In the present invention, the storage modulus of the pressure-sensitive adhesive layer at 85° C. is not particularly limited as long as it is $5.0 \times 10^4$ Pa or more, but preferably $6.0 \times 10^4$ Pa or more, more preferably $9.0 \times 10^4$ Pa or more, still more preferably $1.2 \times 10^5$ Pa or more, and particularly preferably $1.5 \times 10^5$ Pa or more. On the other hand, the upper limit of the storage modulus is usually $2.0 \times 10^5$ Pa or less from the viewpoint of preventing peeling in a durability test.

(2-7. Gel Fraction after Aging Treatment)

The embodiments of a method for controlling a gel fraction after aging treatment in a range of 70% or more and 93% or less include, for example, the following (4) or (5).

In the following (4) or (5), the range of a creep value defined in the present invention can be controlled.

(4) In the (meth)acryl-based polymer (A), 8 to 12% by weight of methyl methacrylate, 2 to 7% by weight of acrylic acid and 0.1 to 0.3% by weight of hydroxyl group-containing (meth)acrylate are used as monomer components. The weight average molecular weight Mw of the (meth)acryl-based polymer (A) is set to 1,500,000 to 2,500,000, and an isocyanate crosslinking agent is contained in an amount of 0.1 to 1 part by weight with respect to 100 parts by weight of the (meth)acryl-based polymer (A).

(5) The (meth)acryl-based polymer (A) contains 2 to 7% by weight of acrylic acid as a monomer component, does not contain a hydroxyl group-containing (meth)acrylate, is set to have a weight average molecular weight Mw of 800,000 to 1,200,000, and contains 4 to 8 parts by weight of an isocyanate-based crosslinking agent with respect to 100 parts by weight of the (meth)acryl-based polymer (A).

(2-8. Formation of Pressure-Sensitive Adhesive Layer)

The pressure-sensitive adhesive layer is formed using the pressure-sensitive adhesive composition. When the pressure-sensitive adhesive layer is formed, it is preferred that the total amount of the crosslinking agents to be added is adjusted and the effects of the temperature and time of crosslinking treatment are sufficiently taken into consideration.

The temperature and time of crosslinking treatment can be adjusted depending on the type of crosslinking agents used. The temperature of crosslinking treatment is preferably 170° C. or less. The crosslinking treatment may be performed at the same temperature as in the step of drying the pressure-sensitive adhesive layer or may be performed in a crosslinking treatment step separately provided after the drying step. The time of crosslinking treatment can be set in consideration of productivity and workability, but is usually about 0.2 to 20 minutes, preferably about 0.5 to 10 minutes.

A method for forming the pressure-sensitive adhesive layer is not particularly limited, and may be a method in which the pressure-sensitive adhesive composition is applied onto any substrate, dried with a drier such as a heating oven to evaporate a solvent or the like, and if necessary, subjected to the above-described crosslinking treatment to form a pressure sensitive adhesive layer, which is then transferred onto an optical film or a transparent conductive substrate that will be described later. Alternatively, the pressure-sensitive adhesive layer may be formed by directly applying the pressure-sensitive adhesive composition onto the optical film or the transparent conductive substrate. In the present invention, a method is preferred in which a pressure-sensitive-adhesive-layer-attached optical film is previously formed by forming a pressure-sensitive adhesive layer on an optical film, and then the pressure-sensitive-adhesive-layer-attached optical film is attached to a liquid crystal cell.

The substrate is not particularly limited, and examples thereof include various substrates such as a release film, a transparent resin film substrate, and a polarizing film that will be described later.

Various methods may be used to apply a pressure-sensitive adhesive composition onto the substrate or the optical film. Specific examples thereof include methods such as fountain coater, roll coating, kiss-roll coating, gravure coating, reverse coating, roll brushing, spray coating, dip roll coating, bar coating, knife coating, air knife coating, curtain coating, lip coating, and extrusion coating using a die coater.

The above drying conditions (temperature, time) are not particularly limited and may be appropriately set depending on the composition and concentration of a pressure-sensitive adhesive composition. The temperature is, for example, about 80 to 170° C., preferably 90 to 200° C., and the time is, for example, 1 to 60 minutes, preferably 2 to 30 minutes. If necessary, crosslinking treatment may be performed after drying, and conditions therefor are as described above.

The thickness of the pressure-sensitive adhesive layer (after drying) is not particularly limited, but is preferably 2 to 100 μm, more preferably 2 to 70 μm, still more preferably 2 to 50 μm, and particularly preferably 2 to 30 μm. When the thickness of the pressure-sensitive adhesive layer is less than 2 μm, the pressure-sensitive adhesive layer becomes poor in adhesion to an adherend, and therefore its durability tends to be insufficient under humidified conditions. On the other hand, when the thickness of the pressure-sensitive adhesive layer exceeds 100 μm, the pressure-sensitive adhesive composition is not sufficiently dried when applied and dried to form the pressure-sensitive adhesive layer, so that foam remains and the pressure-sensitive adhesive layer has surface irregularities causing thickness variations, and therefore a problem in external appearance is likely to become apparent.

Examples of a material constituting the release film include appropriate thin sheet-shaped materials such as resin films (e.g. polyethylene, polypropylene, polyethylene terephthalate, polyester film, etc.), porous materials (e.g. paper, fabric, nonwoven fabric, etc.), nets, foamed sheets, metallic foils, and laminates thereof. From the viewpoint of excellent surface smoothness, resin films are suitably used. Examples of the resin films include polyethylene films, polypropylene films, polybutene films, polybutadiene films, polymethylpentene films, polyvinyl chloride films, vinyl chloride copolymer films, polyethylene terephthalate films, polybutylene terephthalate films, polyurethane films, and ethylene-vinyl acetate copolymer films.

The thickness of the release film is usually 5 to 200 μm, preferably about 5 to 100 μm. If necessary, the release film may be subjected to release and antifouling treatment using a silicone-, fluorine-, long chain alkyl- or fatty acid amide-based releasing agent or a silica powder, or an antistatic treatment such as a coating type, a kneading type and a vapor deposition type can also be performed on the release film. Particularly, releasability from the pressure-sensitive adhesive layer can further be improved by appropriately subjecting the surface of the release film to release treatment, such as silicone treatment, long-chain alkyl treatment, or fluorine treatment.

The transparent resin film substrate is not particularly limited, and various resin films having transparency are used. The resin film is formed from a single-layer film. Examples of a material thereof include polyester-based resins such as polyethylene terephthalate and polyethylene naphthalate, acetate-based resins, polyethersulfone-based resins, polycarbonate-based resins, polyamide-based resins, polyimide-based resins, polyolefin-based resins, (meth)acrylic resins, polyvinyl chloride-based resins, polyvinylidene chloride-based resins, polystyrene-based resins, polyvinyl alcohol-based resins, polyarylate-based resins, and polyphenylenesulfide-based resins. Among these resins, polyester-based resins, polyimide-based resins, and polyethersulfone-based resins are particularly preferred. The film substrate preferably has a thickness of 15 to 200 μm.

<3. Polarizing Film>

(3-1. Polarizer)

A known polarizer can be used without any particular limitations, but it is preferable to use a polarizer having a thickness of 10 μm or less from the viewpoints of reducing the thickness and suppressing the occurrence of a crack. The thickness of the polarizer is more preferably 8 μm or less, still more preferably 7 μm or less, and even still more preferably 6 μm or less. On the other hand, the thickness of the polarizer is preferably 2 μm or more, and more preferably 3 μm or more.

The polarizer used includes a polyvinyl alcohol-based resin. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these polarizers, a polarizer including a polyvinyl alcohol-based film and a dichroic material such as iodine is preferred.

For example, a polarizer including a uniaxially-stretched polyvinyl alcohol-based film dyed with iodine can be produced by a process including immersing a polyvinyl alcohol film in an aqueous iodine solution to dye the film and stretching the film to 3 to 7 times the original length. If necessary, the film may also be immersed in an aqueous solution of potassium iodide or the like optionally containing boric acid, zinc sulfate, zinc chloride, or other materials. If necessary, the polyvinyl alcohol-based film may be further immersed in water for washing before it is dyed. If the polyvinyl alcohol-based film is washed with water, dirt and any anti-blocking agent can be cleaned from the surface of the polyvinyl alcohol-based film, and the polyvinyl alcohol-based film can also be allowed to swell so that unevenness such as uneven dyeing can be effectively prevented. The film may be stretched before, while, or after it is dyed with iodine. The film may also be stretched in an aqueous solution of boric acid, potassium iodide, or the like or in a water bath.

Typical examples of the thin polarizer include the thin polarizers described in, for example, JP-B1-4751486, JP-B1-4751481, JP-B1-4815544, JP-B1-5048120, JP-B1-5587517, WO 2014/077599 A, and WO 2014/077636 A or thin polarizers obtained by the production methods described in these publications.

The thin polarizer described above should be produced by a process capable of achieving high-ratio stretching to improve polarizing performance, among processes including the steps of stretching and dyeing a laminate. From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These thin polarizers can be obtained by a process including the steps of stretching a laminate of a polyvinyl alcohol-based resin (hereinafter also referred to as PVA-based resin) layer and a stretchable resin substrate and dyeing the laminate. Using this process, the PVA-based resin layer, even when thin, can be stretched without problems such as breakage by stretching, because the layer is supported on the stretchable resin substrate.

(3-2. First Protective Film)

The first protective film is preferably made of a material having a high level of transparency, mechanical strength, thermal stability, water barrier properties, isotropy, and other properties. Examples of such a material include polyester-based polymers such as polyethylene terephthalate and polyethylene naphthalate, cellulose-based polymers such as diacetyl cellulose and triacetyl cellulose, acryl-based polymers such as polymethyl methacrylate, styrene-based polymers such as polystyrene and acrylonitrile-styrene copolymers (AS resins), and polycarbonate-based polymers. Examples of polymers that may be used to form the protective film also include polyolefin-based polymers such as polyethylene, polypropylene, cyclo-based or norbornene-structure-containing polyolefin, and ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers.

The first protective film may also contain any type of one or more appropriate additives. Examples of such additives include ultraviolet absorbers, antioxidants, lubricants, plasticizers, release agents, discoloration preventing agents, flame retardants, nucleating agents, antistatic agents, pigments, and colorants.

The content of the polymer in the first protective film is preferably from 50 to 100% by weight, more preferably from 50 to 99% by weight, even more preferably from 60 to 98% by weight, further more preferably from 70 to 97% by weight. If the content of the polymer in the protective film is less than 50% by weight, high transparency and other properties inherent in the polymer may fail to be sufficiently exhibited.

The first protective film may also be, for example, a retardation film, a brightness enhancement film, or a diffusion film. The retardation film may have an in-plane retardation of 40 nm or more and/or a thickness direction retardation of 80 nm or more. The in-plane retardation is generally adjusted to fall within the range of 40 to 200 nm, and the thickness direction retardation is generally adjusted to fall within the range of 80 to 300 nm. When a retardation film is used as the protective film, the retardation film can also serve as a polarizer protecting film, which contributes to thickness reduction.

The retardation film may be a birefringent film formed by subjecting a thermoplastic resin film to uniaxial or biaxial stretching. The stretching temperature, the stretch ratio, and other conditions may be appropriately selected depending on the retardation value, the film material, and the thickness.

The thickness of the first protective film may be selected as needed. The thickness of the first protective film is from about 1 to about 500 μm in view of strength, workability such as handleability, and thin layer formability. In particular, the thickness of the first protective film is preferably from 1 to 300 μm, more preferably from 5 to 200 μm, still more preferably from 5 to 150 μm, and even still more preferably from 20 to 100 μm.

The pressure-sensitive-adhesive-layer-attached polarizing film according to the present invention may provide a second protective film in the other surface in which the first protective film of a polarizer is not provided. The details of the second protective film are the same as those of the first protective film.

The surface of the second protective film, opposite to its surface where the polarizer is bonded, may be provided with a functional layer such as a hard coat layer, an anti-reflection layer, an anti-sticking layer, a diffusion layer, or an antiglare layer. The functional layer such as a hard coat layer, an anti-reflection layer, an anti-sticking layer, a diffusion layer, or an antiglare layer may be provided as part of the protective film itself or as a layer independent of the protective film.

In the present invention, the linear expansion coefficient of the first protective film provided in the polarizer is not particularly limited as long as the difference in strain amount is satisfied, but the upper limit of the linear expansion coefficient of the first protective film is preferably $7.0\times10^{-5}$/K or less, more preferably $6.0\times10^{-5}$/K or less, still more preferably $5.0\times10^{-5}$/K or less, and particularly preferably $4.0\times10^{-5}$/K or less. By controlling the linear expansion coefficient of the first protective film within the above range as well as by controlling the storage modulus at 85° C. and thickness of the pressure-sensitive adhesive layer, it is possible to control the difference in strain amount to a more preferable range.

As a commercially available product of the first protective film satisfying that the linear expansion coefficient is $7.0\times10^{-5}$/K or less, there are exemplified TJ25UL (manufactured by Fujifilm Corporation, raw material: triacetyl cellulose-based polymer, thickness: 25 μm), ZT12 (manufactured by Zeon Corporation, raw material: cycloolefin-based polymer, thickness: 17 μm), KC2UA (manufactured by Konica Minolta, Inc., raw material: triacetyl cellulose-based polymer, thickness: 20 μm), and KC2UGR-HC (manufactured by Konica Minolta, Inc., a film having an acrylic resin hard coat layer on a triacetyl cellulose-based polymer film, thickness: 37 μm).

(3-3. Adhesive Layer)

The adhesive layer is made from an adhesive. Any of various types of adhesives may be used. The adhesive layer may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

The water-based adhesive may be, for example, an isocyanate-based adhesive, a polyvinyl alcohol-based adhesive, a gelatin-based adhesive, a vinyl-based adhesive, a latex-based adhesive, or a water-based polyester adhesive. The water-based adhesive is generally used in the form of an aqueous solution, which generally has a solids content of 0.5 to 60% by weight.

The active energy ray-curable adhesive is an adhesive capable of being cured by exposure to active energy rays such as electron beams or ultraviolet rays (a radically or cationically curable adhesive). The active energy ray-curable adhesive to be used may be of, for example, an electron beam-curable type or an ultraviolet-curable type. The active energy ray-curable adhesive may be, for example, a photo-radically curable adhesive. The photo-radically curable type active energy ray-curable adhesive may be of an ultraviolet-curable type. In this case, the adhesive should contain a radically polymerizable compound and a photopolymerization initiator.

The method for applying the adhesive is appropriately selected depending on the viscosity of the adhesive and the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

When the water-based adhesive or the like is used, the adhesive is preferably applied so as to finally form an adhesive layer with a thickness of 30 to 300 nm. The thickness of the adhesive layer is more preferably from 60 to 250 nm. On the other hand, when the active energy ray-curable adhesive is used, the adhesive layer is preferably formed with a thickness of 0.1 to 200 μm. The thickness is more preferably from 0.5 to 50 μm, even more preferably from 0.5 to 10 μm.

In the process of laminating the polarizer and the first protective film or the second protective film, an adhesion-facilitating layer may be placed between the protective film and the adhesive layer. The adhesion-facilitating layer may be made of, for example, any of various resins having a polyester skeleton, a polyether skeleton, a polycarbonate skeleton, a polyurethane skeleton, a silicone skeleton, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

The adhesion-facilitating layer is usually provided in advance on the first protective film and the second protective film, and then the adhesion-facilitating layer side of the first protective film and the second protective film is bonded to the polarizer with the adhesive layer. The adhesion-facilitating layer can be formed using a known technique that includes applying an adhesion-facilitating-layer-forming material onto the first protective film and the second protective film, and drying the material. The adhesion-facilitating-layer-forming material is generally prepared in the form of a solution which is diluted to a suitable concentration taking into account the coating thickness after drying, the smoothness of the application, and other factors. After dried, the adhesion-facilitating layer preferably has a thickness of 0.01 to 5 μm, more preferably 0.02 to 2 μm, even more preferably 0.05 to 1 μm. Two or more adhesion-facilitating layers may be provided. Also in this case, the total thickness of the adhesion-facilitating layers preferably falls within these ranges.

<4. Image Display Device>

The image display device of the present invention only needs to include the pressure-sensitive-adhesive-layer-attached polarizing film of the present invention, and other configurations can be the same as those of a conventional image display device. The pressure-sensitive-adhesive-layer-attached polarizing film is applied to an image display cell. For example, when the image display device is a liquid crystal display device, the pressure-sensitive-adhesive-layer-attached polarizing film can be applied to either the viewing side or the backlight side of the image display cell (liquid crystal cell). When the image display device is an organic EL display device, the pressure-sensitive-adhesive-layer-attached polarizing film can be applied to the viewing side of the image display cell. Since the image display device of the present invention includes the pressure-sensitive-adhesive-layer-attached polarizing film, such an image display device has high reliability.

EXAMPLES

Hereinbelow, the present invention will be specifically described with reference to Examples but is not limited to these Examples. It is to be noted that parts and percentages in each of Examples are all by weight.

Production Example 1

(Production of HC-Attached 40 μm TAC Film)

To a resin solution (manufactured by DIC Corporation, trade name: "UNIDIC 17-806", solid content concentration: 80%), which was obtained by dissolving a UV-curable resin monomer or oligomer using urethane acrylate as a main component in butyl acetate, were added 5 parts of a photopolymerization initiator (manufactured by BASF, trade name: "IRGACURE 907") and 0.1 parts of a leveling agent (manufactured by DIC Corporation, trade name: "GRANDIC PC4100") with respect to 100 parts of a solid content in the solution. Then, cyclopentanone and propylene glycol monomethyl ether were added at a ratio of 45:55 to the above solution so that the solid content concentration in the solution became 36%. Thus, a hard coat layer-forming material was produced. The hard coat layer-forming material thus obtained was applied onto TJ40UL (manufactured by Fujifilm Corporation, thickness: 40 μm) to form a coating film so that the thickness of a hard coat after curing became 7 μm. After that, the coating film was dried at 90° C. for 1 minute, and was then irradiated with UV light having a cumulative light quantity of 300 mJ/cm$^2$ from a high-pressure mercury lamp, thereby to form a hard coat layer from which an HC-attached 40 μm TAC film was prepared.

Production Example 2

(Production of 30 μm Acrylic Film)

A 30-L reaction vessel equipped with a stirring apparatus, a temperature sensor, a cooling tube, and a nitrogen introduction tube was charged with 8,000 g of methyl methacrylate (MMA), 2,000 g of methyl 2-(hydroxymethl)acrylate (MHMA), 10,000 g of 4-methyl-2-pentanone (methyl isobutyl ketone, MIBK), and 5 g of n-dodecyl mercaptane, and the mixture thus obtained was raised in temperature to 105° C. while nitrogen was being passed in the vessel, whereby the mixture was refluxed. At this time, while 5.0 g of tert-butyl peroxy isopropyl carbonate (KAYACARBON BIC-7, manufactured by Kayaku Akzo Corporation) was added as a polymerization initiator, and a solution formed of 10.0 g of tert-butyl peroxy isopropyl carbonate and 230 g of MIBK was dropped over 4 hours, after which time a solution polymerization was conducted under refluxing at about 105 to 120° C. and aging was conducted further over 4 hours.

To the obtained polymer solution, 30 g of stearyl phosphate/distearyl phosphate mixture (PHOSLEX A-18, manufactured by Sakai Chemical Industrial Co., Ltd.) was added, and a cyclization condensation reaction was conducted for 5 hours under refluxing at about 90 to 120° C. Then, the polymer solution obtained by the cyclization condensation reaction was introduced into a bent-type screw biaxial extruder (φ=29.75 mm, L/D=30) with one rear bent and four front bents at a barrel temperature of 260° C., a rotation number of 100 rpm, a decompression degree of 13.3 to 400 hPa (10 to 300 mmHg) at a processing rate of 2.0 kg/h in terms of a resin amount conversion. A cyclization condensation reaction and degassing were performed in the extruder, and the polymer solution was extruded, whereby transparent pellets of a lactone ring-containing polymer were obtained.

When a dynamic TG of the obtained lactone ring-containing polymer was measured, a mass decrease of 0.17% by mass was detected. The lactone ring-containing polymer had a weight average molecular weight of 133,000, a melt flow rate of 6.5 g/10 min, and a glass transition temperature of 131° C.

The obtained pellets and an acrylonitrile-styrene (AS) resin (Toyo AS AS20, manufactured by Toyo Styrene Co., Ltd.) were kneaded and extruded at a mass ratio of 90/10 using a single screw extruder (screw 30 mmφ), thereby to obtain transparent pellets. The glass transition temperature of the obtained pellets was 127° C.

The pellets were melt-extruded from a coat hanger type T die having a width of 400 mm using a 50 mmφ single screw extruder to prepare a film having a thickness of 120 μm. The produced film was stretched 2.0 times in the longitudinal direction and 2.0 times in the transverse direction under a temperature condition of 150° C. using a biaxial stretching device to obtain a stretched film having a thickness of 30 μm (30 μm acrylic film). When optical properties of this stretched film were measured, the film had a total light transmittance of 93%, an in-plane retardation Δnd of 0.8 nm, and a thickness direction retardation Rth of 1.5 nm.

Production Example 3

(Production of 20 μm Acrylic Film)

A 20 μm-thick stretched film (20 μm acrylic film) was obtained in the same manner as in Production Example 2 except that the film thickness after melt extrusion was 80 μm. When optical properties of this stretched film were measured, the film had a total light transmittance of 93%, an in-plane retardation Δnd of 0.8 nm, and a thickness direction retardation Rth of 1.5 nm.

<Production of Acryl-Based Polarizing Film (1)>

A polyvinyl alcohol film having a thickness of 45 μm was stretched to 3 times between rolls different in velocity ratio while dyed in a 0.3% iodine solution at 30° C. for 1 minute. Then, the film was stretched to a total stretch ratio of 6 times while immersed in an aqueous solution containing 4% boric acid and 10% potassium iodide at 60° C. for 0.5 minutes. Subsequently, the film was washed by immersion in an aqueous solution containing 1.5% potassium iodide at 30° C. for 10 seconds and was then dried at 50° C. for 4 minutes to obtain a polarizer having a thickness of 18 μm. An HC-attached 40 μm TAC film subjected to saponification was bonded to one surfaces of the polarizer and a 30 μm acrylic film was bonded to the other surface of the polarizer with a polyvinyl alcohol adhesive to produce an acryl-based polarizing film (1).

<Production of Acryl-Based Polarizing Film (2)>

A polyvinyl alcohol film having a thickness of 45 μm was stretched to 3 times between rolls different in velocity ratio while dyed in a 0.3% iodine solution at 30° C. for 1 minute. Then, the film was stretched to a total stretch ratio of 6 times while immersed in an aqueous solution containing 4% boric acid and 10% potassium iodide at 60° C. for 0.5 minutes. Subsequently, the film was washed by immersion in an aqueous solution containing 1.5% potassium iodide at 30° C. for 10 seconds and was then dried at 50° C. for 4 minutes to obtain a polarizer having a thickness of 18 μm. An HC-attached 40 μm TAC film subjected to saponification was bonded to one surfaces of the polarizer and a 20 μm acrylic film was bonded to the other surface of the polarizer with a polyvinyl alcohol adhesive to produce an acryl-based polarizing film (2).

<Production of TAC-Based Polarizing Film (3)>

A polyvinyl alcohol film having a thickness of 45 μm was stretched to 3 times between rolls different in velocity ratio while dyed in a 0.3% iodine solution at 30° C. for 1 minute. Then, the film was stretched to a total stretch ratio of 6 times while immersed in an aqueous solution containing 4% boric acid and 10% potassium iodide at 60° C. for 0.5 minutes.

Subsequently, the film was washed by immersion in an aqueous solution containing 1.5% potassium iodide at 30° C. for 10 seconds and was then dried at 50° C. for 4 minutes to obtain a polarizer having a thickness of 18 µm. An HC-attached 40 µm TAC film subjected to saponification was bonded to one surfaces of the polarizer and a 40 µm triacetyl cellulose film subjected to saponification (KC4CT, manufactured by Konica Minolta, Inc.) was bonded to the other surface of the polarizer with a polyvinyl alcohol adhesive to produce a TAC-based polarizing film (3).

Example 1

(Preparation of Acryl-Based Polymer (A1))

A monomer mixture of 99 parts of butyl acrylate and 1 part of 4-hydroxybutyl acrylate were charged into a four-necked flask equipped with a stirring blade, a thermometer, a nitrogen gas inlet tube, and a cooler. To 100 parts (solid content) of the monomer mixture, 0.1 parts of 2,2'-azobi-sisobutyronitrile as a polymerization initiator was charged together with 100 parts of ethyl acetate, and nitrogen gas was introduced with gentle stirring to substitute the atmosphere, polymerization reaction was carried out for 8 hours while maintaining the liquid temperature in the flask at around 55° C. to prepare a solution of an acryl-based polymer (A1) having a weight average molecular weight (Mw) of 1,800,000.

(Preparation of Pressure-Sensitive Adhesive Composition)

A solution of an acryl-based pressure-sensitive adhesive composition was prepared by adding 0.02 parts of an isocyanate crosslinking agent (trade name "TAKENATE D110N", trimethylolpropane/xylylene diisocyanate adduct, manufactured by Tosoh Corporation), 0.3 parts of a peroxide crosslinking agent (trade name "NYPER BMT", manufactured by NOF Corporation), and 0.2 parts of a silane coupling agent (trade name "X-41–1056", manufactured by Shin-Etsu Chemical Co., Ltd.) with respect to 100 parts of the solid content of the acryl-based polymer (A1) solution obtained above.

(Production of Pressure-Sensitive-Adhesive-Layer-Attached Polarizing Film)

Next, the solution of acryl-based pressure-sensitive adhesive composition obtained above was applied to one side of a polyethylene terephthalate film (separator film: trade name "MRF 38" manufactured by Mitsubishi Polyester Film Co., Ltd.) so that the thickness of the pressure-sensitive adhesive layer after drying was 20 µm and dried at 155° C. for 1 minute to form a pressure sensitive adhesive layer on the surface of the separator film. Then, the pressure-sensitive adhesive layer formed on the separator film was transferred to the 30 µm acrylic film side of the acryl-based polarizing film (1) obtained above to produce a pressure-sensitive-adhesive-layer-attached polarizing film.

<Preparation of Acrylic Oligomer>

A four-necked flask equipped with a stirring blade, a thermometer, a nitrogen gas introduction tube, and a cooler was charged with 95 parts by weight of butyl acrylate (BA), 2 parts by weight of acrylic acid (AA), 3 parts by weight of methyl acrylate (MA), 0.1 parts by weight of 2,2'-azobi-sisobutyronitrile (AIBN) as a polymerization initiator, and 140 parts by weight of toluene, and nitrogen gas was introduced to the flask with gentle stirring to perform a nitrogen purge in the flask. After that, polymerization reaction was carried out for 8 hours while maintaining the liquid temperature at around 70° C. to prepare an acrylic oligomer solution. The weight average molecular weight of the above oligomer was 4,500.

Examples 2 to 16 and Comparative Examples 1 to 3

In Example 1, the kinds of monomers used to prepare an acryl-based polymer and the use ratio of monomers were changed as shown in Table 1, and production conditions were controlled to prepare solutions of acryl-based polymers each having a weight average molecular weight (Mw) shown in Table 1.

Further, in the same manner as in Example 1 except that the kind or amount of the crosslinking agent, acrylic oligomer, or silane coupling agent used in the pressure-sensitive adhesive was changed as shown in Table 1, a solution of an acryl-based pressure-sensitive adhesive composition was prepared. A pressure-sensitive adhesive layer was formed on a separator film in the same manner as in Example 1 using the solution of the acryl-based pressure-sensitive adhesive composition, and the pressure-sensitive adhesive layer was transferred to the protective film side, which was not hard-coated, of each polarizing film shown in Table 1, thereby to prepare a pressure-sensitive-adhesive-layer-attached polarizing film.

<Measurement of Weight Average Molecular Weight of (Meth)Acryl-Based Polymer (A)>

The weight average molecular weight (Mw) of a (meth) acryl-based polymer (A) was measured by GPC (gel permeation chromatography). Similarly, Mw/Mn was measured.

Analyzer: HLC-8120GPC, manufactured by Tosoh Corporation

Column: $G7000H_{XL}+GMH_{XL}+GMH_{XL}$, manufactured by Tosoh Corporation

Column size: 7.8 mmϕ×30 cm (each column), 90 cm in total

Column temperature: 40° C.

Flow rate: 0.8 mL/min

Injection volume: 100 µL

Eluent: tetrahydrofuran

Detector: differential refractometer (RI)

Standard sample: polystyrene

<Measurement of Linear Expansion Coefficient (/K) of Protective Film>

Using a TMA analyzer (TMA7100E manufactured by Hitachi High-Tech Science Corp.), a dimensional change amount of a protective film was measured under the following measurement conditions, and the obtained value was substituted into the following formula (A) to calculate a dimensional change rate. The measurement was performed 4 times and the average value of 4 times measurements was defined as the dimensional change rate. Then, the average value of the obtained dimensional change rates was substituted into the following formula (B) to calculate a linear expansion coefficient (/K) of the protective film.

Sample size: 20 mm×5 mm

Measurement environment: −40° C.↔85° C.

Temperature rise/fall rate: 10° C./min

Number of measurements: 4

Dimensional change rate=$(\Delta L/L) \times 100$ (A)

$\Delta L$: Dimensional change amount during measurement (Difference in dimensions between at −40° C. and at 85° C.)

L: Dimension before measurement (dimension at 25° C.)

Linear expansion coefficient (/K)=(Dimensional change rate/$\Delta T$)/100 (B)

$\Delta T$: Range of temperature changes

TABLE 1

| | Polarizing film | Pressure-sensitive adhesive layer | Linear expansion coefficient, of protective film (×10⁻⁵/K) | (Meth)acryl-based polymer | Composition | | | |
|---|---|---|---|---|---|---|---|---|
| | | | | | BA (parts by weight) | MMA (parts by weight) | AA (parts by weight) | HBA (parts by weight) |
| Example 1 | Acryl-based (1) | Pressure-sensitive adhesive layer (1) | 6.9 | (A1) | 99 | | | 1 |
| Example 2 | Acryl-based (1) | Pressure-sensitive adhesive layer (2) | 6.9 | (A1) | 99 | | | 1 |
| Example 3 | Acryl-based (1) | Pressure-sensitive adhesive layer (3) | 6.9 | (A2) | 94.9 | | 5 | |
| Example 4 | Acryl-based (1) | Pressure-sensitive adhesive layer (4) | 6.9 | (A2) | 94.9 | | 5 | |
| Example 5 | Acryl-based (1) | Pressure-sensitive adhesive layer (5) | 6.9 | (A3) | 95 | | 5 | |
| Example 6 | Acryl-based (1) | Pressure-sensitive adhesive layer (6) | 6.9 | (A4) | 86.9 | 8 | 5 | |
| Example 7 | Acryl-based (1) | Pressure-sensitive adhesive layer (7) | 6.9 | (A4) | 86.9 | 8 | 5 | |
| Example 8 | Acryl-based (2) | Pressure-sensitive adhesive layer (5) | 6.0 | (A3) | 95 | | 5 | |
| Example 9 | Acryl-based (2) | Pressure-sensitive adhesive layer (6) | 6.0 | (A4) | 86.9 | 8 | 5 | |
| Example 10 | TAC-based (3) | Pressure-sensitive adhesive layer (1) | 3.6 | (A1) | 99 | | | 1 |
| Example 11 | TAC-based (3) | Pressure-sensitive adhesive layer (2) | 3.6 | (A1) | 99 | | | 1 |
| Example 12 | TAC-based (3) | Pressure-sensitive adhesive layer (3) | 3.6 | (A2) | 94.9 | | 5 | |
| Example 13 | TAC-based (3) | Pressure-sensitive adhesive layer (4) | 3.6 | (A2) | 94.9 | | 5 | |
| Example 14 | TAC-based (3) | Pressure-sensitive adhesive layer (5) | 3.6 | (A3) | 95 | | 5 | |
| Example 15 | TAC-based (3) | Pressure-sensitive adhesive layer (6) | 3.6 | (A4) | 86.9 | 8 | 5 | |
| Example 16 | TAC-based (3) | Pressure-sensitive adhesive layer (7) | 3.6 | (A4) | 86.9 | 8 | 5 | |
| Comparative Example 1 | Acryl based (1) | Pressure-sensitive adhesive layer (8) | 6.9 | (A1) | 99 | | | 1 |
| Comparative Example 2 | Acryl-based (1) | Pressure-sensitive adhesive layer (9) | 6.9 | (A2) | 94.9 | | 5 | |
| Comparative Example 3 | TAC-based (3) | Pressure-sensitive adhesive layer (9) | 3.6 | (A2) | 94.9 | | 5 | |

| | Composition | | Crosslinking agent | | | Acrylic oligomer (parts by weight) | Silane-coupling agent (parts by weight) | Thickness (μm) |
|---|---|---|---|---|---|---|---|---|
| | HEA (parts by weight) | Mw | D110N (parts by weight) | C/L (parts by weight) | Peroxide (parts by weight) | | | |
| Example 1 | | 1.8 million | 0.02 | | 0.3 | | 0.2 | 20 |
| Example 2 | | 1.8 million | 0.1 | | 0.3 | | 0.2 | 20 |
| Example 3 | 0.1 | 2.1 million | | 0.1 | | | 0.2 | 20 |
| Example 4 | 0.1 | 2.1 million | | 0.6 | | | 0.2 | 20 |
| Example 5 | | 0.94 million | | 8 | | | 0.2 | 20 |
| Example 6 | 0.1 | 1.7 million | | 0.15 | | | 0.2 | 20 |
| Example 7 | 0.1 | 1.7 million | | 1 | | | 0.2 | 20 |
| Example 8 | | 0.94 million | | 8 | | | 0.2 | 20 |
| Example 9 | 0.1 | 1.7 million | | 0.15 | | | 0.2 | 20 |
| Example 10 | | 1.8 million | 0.02 | | 0.3 | | 0.2 | 20 |
| Example 11 | | 1.8 million | 0.1 | | 0.3 | | 0.2 | 20 |
| Example 12 | 0.1 | 2.1 million | | 0.1 | | | 0.2 | 20 |

TABLE 1-continued

| | | | | | | | |
|---|---|---|---|---|---|---|---|
| Example 13 | 0.1 | 2.1 million | 0.6 | | | 0.2 | 20 |
| Example 14 | | 0.94 million | 8 | | | 0.2 | 20 |
| Example 15 | 0.1 | 1.7 million | 0.15 | | | 0.2 | 20 |
| Example 16 | 0.1 | 1.7 million | 1 | | | 0.2 | 20 |
| Comparative Example 1 | | 1.8 million | 0.02 | 0.3 | 30 | 0.2 | 20 |
| Comparative Example 2 | 0.1 | 2.1 million | 8 | | | 0.2 | 20 |
| Comparative Example 3 | 0.1 | 2.1 million | 8 | | | 0.2 | 20 |

Abbreviations in Table 1 are as follows.

BA: butyl acrylate

MMA: methyl methacrylate

AA: acrylic acid

HBA: 4-hydroxybutyl acrylate

HEA: 2-hydroxyethyl acrylate

D110N: trimethylolpropane/xylylene diisocyanate adduct (manufactured by Tosoh Corporation under the trade name of "TAKENATE D110N")

C/L: trimethylolpropane/tolylene diisocyanate adduct (manufactured by Tosoh Corporation under the trade name of "CORONATE L")

Peroxide: peroxide crosslinking agent (manufactured by NOF Corporation under the trade name of "NYPER BMT")

Silane coupling agent: epoxy group-containing oligomer type silane coupling agent (manufactured by Shin-Etsu Chemical Co., Ltd. under the trade name of "X-41-1056").

<Measurement Method of Creep Value>

The upper end portion of 10 mm×10 mm of a pressure-sensitive-adhesive-layer-attached polarizing film (pressure-sensitive adhesive layer thickness: 20 μm) cut into a size of 10 mm×30 mm was bonded to an SUS plate via a pressure-sensitive adhesive layer and autoclaved for 15 minutes under the conditions of 50° C. and 5 atm. A precision hot plate placed so that the heating surface was vertical was heated to 85° C., and the SUS plate to which the pressure-sensitive-adhesive-layer-attached polarizing film was placed so that the surface on which the pressure-sensitive adhesive layer was not bonded was in contact with the heating surface of the hot plate. After 5 minutes from starting to heat the SUS plate at 85° C., a load of 500 g was applied to the lower end of the pressure-sensitive-adhesive-layer-attached polarizing film and allowed to stand for 1 hour. The deviation width between the pressure-sensitive-adhesive-layer-attached polarizing film and the SUS plate before and after such loading was measured, and the deviation width was defined as a creep value (μm) at 85° C.

<Measurement of Storage Modulus of Pressure-Sensitive Adhesive Layer>

A test sample having a thickness of 2 mm was produced by laminating only the pressure-sensitive adhesive layers of each Example and Comparative Example. The test sample was punched into a disk shape having a diameter of 7.9 mm, sandwiched between parallel plates, and dynamic viscoelasticity measurement was performed using "Advanced Rheometric Expansion System (ARES)" manufactured by Rheometric Scientific Co., Ltd. under the following conditions. From the measurement results, a storage modulus (Pa) of the pressure-sensitive adhesive layer at 85° C. was read.

(Measurement Conditions)

Deformation mode: torsion

Measurement temperature: −40° C. to 150° C.

Temperature rising rate: 5° C./min

<Irregular Shape Processing>

Figure 1:
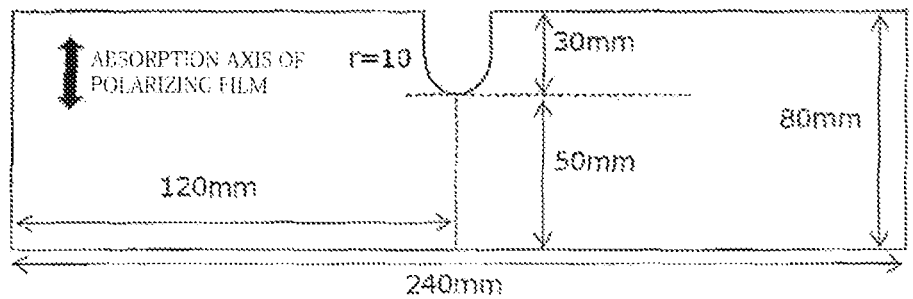
FIG. 1 is a view showing a pressure-sensitive-adhesive-layer-attached polarizing film having a U notch on the outer peripheral portion, said polarizing film being produced in an example of the present invention.

The produced pressure-sensitive-adhesive-layer-attached polarizing film was processed into a shape shown in FIG. 1 using a $CO_2$ laser processing machine Spirit (30 W manufactured by GCC) under the conditions of a speed of 10 and a laser output of 35,400 ppi.

<Measurement of Strain Amount of Polarizing Film>

Figure 2:
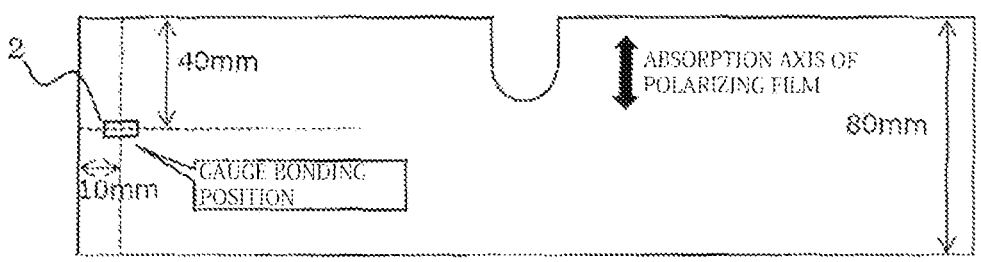
FIG. 2 is a view showing a model for measuring a strain amount of the pressure-sensitive-adhesive-layer-attached polarizing film having an irregular shape of the present invention.
Figure 3:
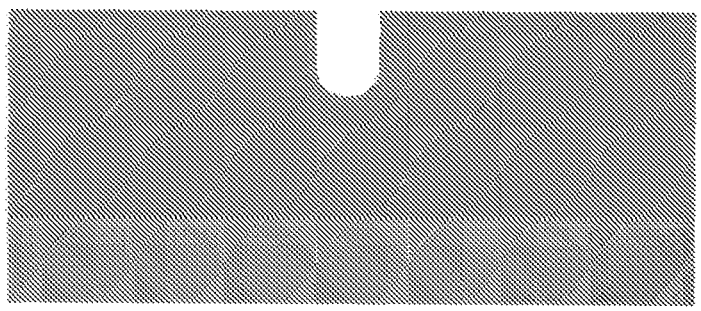
FIG. 3 is a view showing one embodiment of the pressure-sensitive-adhesive-layer-attached polarizing film having a U notch on the outer peripheral portion of the present invention.
Figure 4:
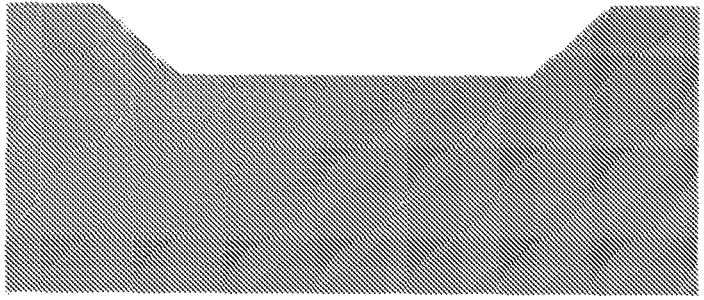
FIG. 4 is a view showing one embodiment of the pressure-sensitive-adhesive-layer-attached polarizing film having a U notch on the outer peripheral portion of the present invention.
Figure 5:
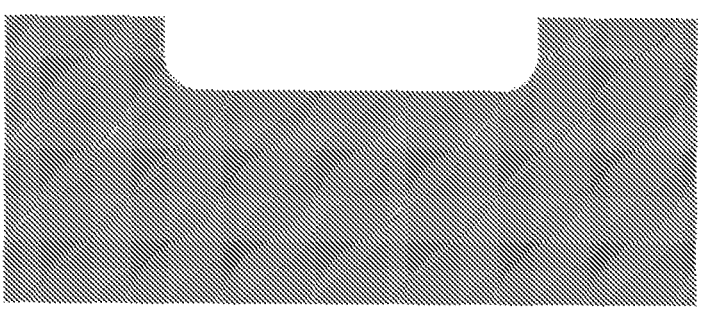
FIG. 5 is a view showing one embodiment of the pressure-sensitive-adhesive-layer-attached polarizing film having a U notch on the outer peripheral portion of the present invention.
Figure 6:
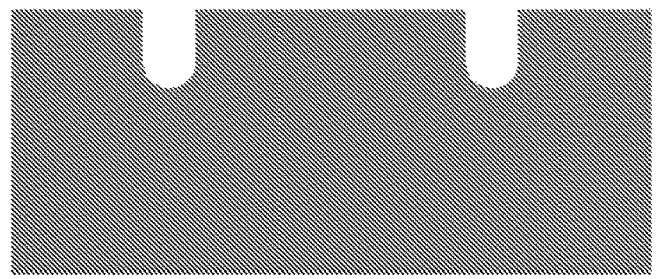
FIG. 6 is a view showing one embodiment of the pressure-sensitive-adhesive-layer-attached polarizing film having a U notch on the outer peripheral portion of the present invention.

The pressure-sensitive-adhesive-layer-attached polarizing film subjected to irregular shape processing was bonded to 350×250 mm×0.7 mm thick non-alkali glass (trade name "EG-XG" manufactured by Corning Inc.), and then autoclaved at 50° C. under a pressure of 0.5 MPa for 15 minutes, so that the pressure-sensitive adhesive layer was brought into close contact with the glass to obtain a sample. The hard coat surface at the position shown in FIG. 2 of the pressure-sensitive-adhesive-layer-attached polarizing film of the sample was scraped with sandpaper, and a strain gauge (FLA-3-11-3LJCT, manufactured by Tokyo Measuring Instruments Lab. Co., Ltd.) was bonded to the exposed surface of a protective film with use of a cyanoacrylate adhesive (Aron Alpha, manufactured by Toagosei Co., Ltd.). At this time, the measurement axis of the strain gauge (long side direction of the gauge) was made to be parallel to the long side direction of the pressure-sensitive-adhesive-layer-attached polarizing film that had been subjected to irregular shape processing, so that it became possible to measure the strain amount in the direction perpendicular to the absorption axis of the polarizing plate. The strain gauge-bonded sample was placed in a heat cycle test tank, and a lead wire of the strain gauge was connected to a data logger (TDS-530, manufactured by Tokyo Measuring Instruments Lab. Co., Ltd.). After adjusting the strain amount at room temperature (23° C.) to 0με, the sample was exposed to the following test conditions for 10 cycles, and the strain amount was measured every minute. The strain amount at the time of 15 minutes (intermediate point) in the holding time (30 min) at each temperature of −40° C. and 85° C. in the 10th cycle was read and used as a strain amount of the polarizing film at each temperature. The difference in strain amount was calculated by the following formula (1).

(Test Conditions)

Temperature condition: −40° C. (holding for 30 minutes) ⇒85° C. (holding for 30 minutes) is repeated as one cycle.

Temperature rising/falling rate: 10° C./min

Difference in strain amount=(Strain amount at 85° C.)−(Strain amount at −40° C.)   Formula (1)

<Evaluation of Cracks Occurring in Irregularly Shaped Portion>

The pressure-sensitive-adhesive-layer-attached polarizing film subjected to irregular shape processing was bonded to a non-alkali glass having a thickness of 350×250 mm×0.7 mm (trade name "EG-XG", manufactured by Corning Inc.), and then autoclaved at 50° C. under a pressure of 0.5 MPa for 15 minutes, so that the pressure-sensitive adhesive layer was brought into close contact with the glass. The sample subjected to such treatment was put into a heat cycle test tank, and the presence or absence of cracks occurring in the irregularly shaped portion at the time of 50 cycles, 100 cycles, 200 cycles, and 300 cycles was visually confirmed. The same four samples were charged for each condition, and Table 1 shows the number of samples in which cracks occurred.

(Test Conditions)

Temperature condition: −40° C. (holding for 30 minutes)⇒85° C. (holding for 30 minutes) is repeated as one cycle.

Temperature rising/falling rate: 10° C./min

<Evaluation of Panel Warpage Amount>

The produced pressure-sensitive-adhesive-layer-attached polarizing film was cut into a size of 300×220 mm so that the absorption axis of the polarizing film was parallel to the long side. The pressure-sensitive-adhesive-layer-attached polarizing film was bonded to a non-alkali glass having a thickness of 195×125 mm×0.4 mm (trade name "EG-XG", manufactured by Corning Inc.) with a laminator. Subsequently, the polarizing film was autoclaved at 50° C. under a pressure of 0.5 MPa for 15 minutes, so that the pressure-sensitive adhesive layer was brought into close contact with the glass. The sample subjected to such treatment was treated for 24 hours in an atmosphere at 85° C., and then placed at room temperature for 1 hour. Facing up the surface to which the pressure-sensitive-adhesive-layer-attached polarizing film was bonded, the sample was placed on a flat table so that the four corners were raised, and the height of the four corners were measured using a laser displacement meter (product name: LK-G35, manufactured by Keyence Corporation). The height was measured on the surface of the polarizing film, and after subtracting the thicknesses of the glass and the pressure-sensitive-adhesive-layer-attached polarizing film from the measured value, the respective values of the four corners was averaged to obtain an average value which was defined as a warpage amount.

<Durability Test>

The produced pressure-sensitive-adhesive-layer-attached polarizing film was cut into a size of 300×220 mm so that the absorption axis of the polarizing film was parallel to the long side. The pressure-sensitive-adhesive-layer-attached polarizing film was bonded to a non-alkali glass having a thickness of 350×250 mm×0.7 mm (trade name "EG-XG", manufactured by Corning Inc.) with a laminator. Subsequently, the pressure-sensitive adhesive layer was brought into close contact with the glass by autoclaving at 50° C. under a pressure of 0.5 MPa for 15 minutes. After the sample subjected to such treatment was treated for 500 hours in an atmosphere at 95° C. and further treated for 500 hours in an atmosphere of 65° C./95% RH, the appearance of the sample was visually evaluated according to the following criteria.

(Evaluation Criteria)

⊙: No change in appearance such as foaming or peeling was observed.

○: Peeling at edges or foaming was slightly observed, which however did not cause any problem in practical use.

Δ: Peeling at edges or foaming was observed, which however did not practically cause any problem in applications other than special applications.

x: Significant peeling at edges was observed, which caused a problem in practical use.

TABLE 2

| | Polarizing film | Pressure-sensitive adhesive layer | 85° C. creep (μm) | 85° C. storage modulus (Pa) | Difference of strain amount (με) |
|---|---|---|---|---|---|
| Example 1 | Acryl-based (1) | Pressure-sensitive adhesive layer (1) | 357 | 5.2E+04 | 2763 |
| Example 2 | Acryl-based (1) | Pressure-sensitive adhesive layer (2) | 90 | 5.2E+04 | 2752 |
| Example 3 | Acryl-based (1) | Pressure-sensitive adhesive layer (3) | 123 | 6.2E+04 | 2315 |
| Example 4 | Acryl-based (1) | Pressure-sensitive adhesive layer (4) | 64 | 8.1E+04 | 2145 |
| Example 5 | Acryl-based (1) | Pressure-sensitive adhesive layer (5) | 31 | 1.7E+05 | 320 |
| Example 6 | Acryl-based (1) | Pressure-sensitive adhesive layer (6) | 330 | 9.0E+04 | 1881 |
| Example 7 | Acryl-based (1) | Pressure-sensitive adhesive layer (7) | 46 | 9.7E+04 | 1484 |
| Example 8 | Acryl-based (2) | Pressure-sensitive adhesive layer (5) | 31 | 1.7E+05 | 281 |
| Example 9 | Acryl-based (2) | Pressure-sensitive adhesive layer (6) | 46 | 9.7E+04 | 1246 |
| Example 10 | TAC-based (3) | Pressure-sensitive adhesive layer (1) | 357 | 5.2E+04 | 2086 |
| Example 11 | TAC-based (3) | Pressure-sensitive adhesive layer (2) | 90 | 5.2E+04 | 2051 |
| Example 12 | TAC-based (3) | Pressure-sensitive adhesive layer (3) | 123 | 6.2E+04 | 1569 |
| Example 13 | TAC-based (3) | Pressure-sensitive adhesive layer (4) | 64 | 8.1E+04 | 1478 |
| Example 14 | TAC-based (3) | Pressure-sensitive adhesive layer (5) | 31 | 1.7E+05 | 227 |
| Example 15 | TAC-based (3) | Pressure-sensitive adhesive layer (6) | 330 | 9.0E+04 | 1004 |
| Example 16 | TAC-based (3) | Pressure-sensitive adhesive layer (7) | 46 | 9.7E+04 | 934 |
| Comparative Example 1 | Acryl-based (1) | Pressure-sensitive adhesive layer (8) | 701 | 3.0E+04 | 3023 |
| Comparative Example 2 | Acryl-based (1) | Pressure-sensitive adhesive layer (9) | 12 | 1.9E+05 | 264 |
| Comparative Example 3 | TAC-based (3) | Pressure-sensitive adhesive layer (9) | 12 | 1.9E+05 | 90 |

TABLE 2-continued

| | | Number of crack occurrences | | | | | Durability | |
|---|---|---|---|---|---|---|---|---|
| | Maximum strain amount ($\mu\varepsilon$) | −40° C. ⇔ 85° C. 50 times | −40° C. ⇔ 85° C. 100 times | −40° C. ⇔ 85° C. 200 times | −40° C. ⇔ 85° C. 300 times | Warpage amount (mm) 85° C. | 95° C. | 65° C./ 95% RH |
| Example 1 | −4305 | 2 | 4 | 4 | 4 | 2.8 | ○ | ◉ |
| Example 2 | −4236 | 2 | 4 | 4 | 4 | 3.5 | ○ | ○ |
| Example 3 | −3868 | 0 | 3 | 4 | 4 | 3.3 | ◉ | ◉ |
| Example 4 | −3458 | 0 | 3 | 4 | 4 | 3.7 | ◉ | ◉ |
| Example 5 | −1192 | 0 | 0 | 2 | 4 | 4.0 | ◉ | ◉ |
| Example 6 | −3069 | 0 | 1 | 4 | 4 | 2.8 | ○ | ◉ |
| Example 7 | −2205 | 0 | 0 | 4 | 4 | 4.0 | ◉ | ◉ |
| Example 8 | −1031 | 0 | 0 | 1 | 4 | 3.9 | ◉ | ◉ |
| Example 9 | −2005 | 0 | 0 | 2 | 4 | 3.8 | ◉ | ◉ |
| Example 10 | −3287 | 0 | 1 | 4 | 4 | 2.3 | ◉ | ○ |
| Example 11 | −3230 | 0 | 1 | 4 | 4 | 3.3 | ◉ | ○ |
| Example 12 | −2645 | 0 | 0 | 2 | 4 | 3.2 | ◉ | ◉ |
| Example 13 | −2492 | 0 | 0 | 3 | 4 | 3.5 | ◉ | ◉ |
| Example 14 | −801 | 0 | 0 | 0 | 0 | 3.8 | ◉ | ◉ |
| Example 15 | −2177 | 0 | 0 | 0 | 2 | 2.4 | ◉ | ◉ |
| Example 16 | −2050 | 0 | 0 | 0 | 3 | 3.7 | ◉ | ◉ |
| Comparative Example 1 | −4925 | 4 | 4 | 4 | 4 | 2.1 | X | ○ |
| Comparative Example 2 | −878 | 0 | 0 | 2 | 4 | 5.2 | X | Δ |
| Comparative Example 3 | −736 | 0 | 0 | 0 | 0 | 5.0 | X | Δ |

INDUSTRIAL APPLICABILITY

The pressure-sensitive-adhesive-layer-attached polarizing film of the present invention is used alone or as an optical film obtained by laminating the polarizing film in an image display device such as a liquid crystal display device (LCD) or an organic EL display device.

DESCRIPTION OF REFERENCE SIGNS 1 absorption axis and transmission axis of polarizing film
2 strain gauge

The invention claimed is:

1. A pressure-sensitive-adhesive-layer-attached polarizing film comprising:
a polarizing film; and
a pressure-sensitive adhesive layer on one surface of the polarizing film, and having an irregular shape other than a solid rectangular shape, wherein
when a strain gauge is bonded to a surface not having the pressure-sensitive adhesive layer of the polarizing film such that a measurement axis and an absorption axis of the polarizing film intersect at right angles and strain amounts are measured, a difference between a strain amount at −40° C. and a strain amount at 85° C. is 3000$\mu\varepsilon$ or less, and
a creep value of the pressure-sensitive adhesive layer at 85° C. is 15 $\mu$m or more and 200 $\mu$m or less.

2. The pressure-sensitive-adhesive-layer-attached polarizing film according to claim 1, wherein the strain amount at −40° C. is −4000$\mu\varepsilon$ or more.

3. The pressure-sensitive-adhesive-layer-attached polarizing film according to claim 2, wherein
the polarizing film has at least a polarizer and a first protective film,
the first protective film is provided between the polarizer and the pressure-sensitive adhesive layer, and
a linear expansion coefficient of the first protective film is $7.0\times10^{-5}$/K or less.

4. The pressure-sensitive-adhesive-layer-attached polarizing film according to claim 3, wherein the first protective film is formed with a cellulose-based polymer.

5. The pressure-sensitive-adhesive-layer-attached polarizing film according to claim 4, wherein the pressure-sensitive adhesive layer has a thickness of 2 $\mu$m or more and 30 $\mu$m or less.

6. The pressure-sensitive-adhesive-layer-attached polarizing film according to claim 3, wherein the pressure-sensitive adhesive layer has a thickness of 2 $\mu$m or more and 30 $\mu$m or less.

7. The pressure-sensitive-adhesive-layer-attached polarizing film according to claim 2, wherein the pressure-sensitive adhesive layer has a thickness of 2 $\mu$m or more and 30 $\mu$m or less.

8. The pressure-sensitive-adhesive-layer-attached polarizing film according to claim 1, wherein
the polarizing film has at least a polarizer and a first protective film,
the first protective film is provided between the polarizer and the pressure-sensitive adhesive layer, and
a linear expansion coefficient of the first protective film is $7.0\times10^{-5}$/K or less.

9. The pressure-sensitive-adhesive-layer-attached polarizing film according to claim 8, wherein the first protective film is formed with a cellulose-based polymer.

10. The pressure-sensitive-adhesive-layer-attached polarizing film according to claim 9, wherein the pressure-sensitive adhesive layer has a thickness of 2 $\mu$m or more and 30 $\mu$m or less.

11. The pressure-sensitive-adhesive-layer-attached polarizing film according to claim 8, wherein the pressure-sensitive adhesive layer has a thickness of 2 $\mu$m or more and 30 $\mu$m or less.

12. The pressure-sensitive-adhesive-layer-attached polarizing film according to claim 1, wherein the pressure-sensitive adhesive layer has a thickness of 2 µm or more and 30 µm or less.

13. An image display device having the pressure-sensitive-adhesive-layer-attached polarizing film according to claim 1.

* * * * *